US012603640B2

(12) United States Patent
Pellerano et al.

(10) Patent No.: US 12,603,640 B2
(45) Date of Patent: Apr. 14, 2026

(54) TECHNOLOGIES FOR IMPEDANCE MATCHING NETWORKS FOR QUBITS

(71) Applicant: Intel Corporation, Santa Clara, CA (US)

(72) Inventors: Stefano Pellerano, Beaverton, OR (US); JongSeok Park, Hillsboro, OR (US); Lester F. Lampert, Portland, OR (US); Sushil Subramanian, Beaverton, OR (US); Thomas F. Watson, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 300 days.

(21) Appl. No.: 17/528,453

(22) Filed: Nov. 17, 2021

(65) Prior Publication Data
US 2023/0155573 A1 May 18, 2023

(51) Int. Cl.
*H03H 11/28* (2006.01)

(52) U.S. Cl.
CPC .................................. *H03H 11/28* (2013.01)

(58) Field of Classification Search
CPC ........ H03H 7/01; H03H 7/01115; H03H 7/38; H03H 7/0153; H03H 11/28
See application file for complete search history.

(56) References Cited

U.S. PATENT DOCUMENTS

| | | | | |
|---|---|---|---|---|
| 4,837,609 | A | 6/1989 | Gurvitch et al. | |
| 2014/0139221 | A1* | 5/2014 | Schwilch | G01R 33/3657 |
| | | | | 324/322 |
| 2016/0211824 | A1 | 7/2016 | Kando et al. | |
| 2017/0033815 | A1* | 2/2017 | Leipold | H04B 1/0057 |
| 2019/0165172 | A1 | 5/2019 | Joshi et al. | |
| 2020/0373890 | A1* | 11/2020 | Tokuda | H04B 1/18 |
| 2022/0115577 | A1* | 4/2022 | Beck | H03H 7/09 |

FOREIGN PATENT DOCUMENTS

WO        2021005208 A1     1/2021

OTHER PUBLICATIONS

EPO European Extended Search Report in EP Application Serial No. 22202006.7 mailed on Apr. 18, 2023, 10 pages.
(Continued)

*Primary Examiner* — Patrick C Chen
(74) *Attorney, Agent, or Firm* — Alliance IP, LLC

(57) ABSTRACT

Technologies for impedance matching networks for qubits are disclosed. In one illustrative embodiment, an impedance matching network matches a 50 Ohm transmission line to a spin qubit with a state-dependent resistance of 100 kiloohms to 105 kiloohms. The illustrative impedance matching network is tunable, allowing the impedance transformation ratio to be changed without significantly changing the matching frequency of the impedance matching network. In some embodiments, the impedance matching network matches a 50 Ohm transmission line to a lower-resistance state of a qubit. In other embodiments, the impedance matching network matches a 50 Ohm transmission line to an impedance value in between a lower-resistance state and a higher-resistance state of a qubit.

18 Claims, 18 Drawing Sheets

(56) References Cited

OTHER PUBLICATIONS

Han Tianyi et al: "Radio-frequency measurement in semiconductor quantum computation," Science China Physics, Mechanics, vol. 60, No. 5, Mar. 21, 2017 (Mar. 21, 2017) , XP093037413, Beijing ISSN: 1674-7348, DOI: 10.1007/s11433-017-9019-9 Retrieved from the Internet: URL:http://link.springer.com/article/10.10 07/s11433-017-9019-9/fulltext.html>; 13 pages.

Schupp F Jet al: "Radio-frequency reflectometry of a quantum dot using an ultra-low-noise SQUID amplifier," arxiv.org, Cornell University Library, 201 Olin Library Cornell University Ithaca, NY 14853, Jun. 29, 2020 (Jun. 29, 2020), XP081678243, DOI: 10.1063/5.0005886; 10 pages.

Intel Corporation, "Technologies for Scalable Spin Qubit Readout," U.S. Appl. No. 17/695,584, filed Mar. 15, 2022.

Ruffino, A., et al., "Integrated multiplexed microwave readout of silicon quantum dots in a cryogenic CMOS chip," Jan. 20, 2021; Advanced Quantum Architecture Laboratory, Ecole Polytechnique Federale de Lausanne; 14 pages.

Schaal, Simon, et al., "A CMOS dynamic random access architecture for radio-frequency readout of quantum devices," Nature Electronics; vol. 2, pp. 236-242; Jun. 2019; 7 pages.

Sell, B., et al., "22FFL: A high Performance and Ultra Low Power FinFET Technology for Mobile and RF Applications," Intel Corporation, Hillsboro, OR; accessed Jan. 21, 2022; 4 pages.

Crippa, A. et al.; "Gate-reflectometry dispersive readout and coherent control of a spin qubit in silicon;" Nature Communications; (2019) 10:2776; https://doi.org/10.1038/s41467-019-10848-z l www. nature.com/naturecommunications; 6 pages.

Keith, D., et al., "Single-Shot Spin Readout in Semiconductors Near the Shot-Noise Sensitivity Limit;" Physical Review; 041003; 2019; American Physical Society; 11 pages.

Küng, Bruno, "RF Reflectometry Measurements of Quantum Dots;" Zurich Instruments; Feb. 20, 2017; Accessed Feb. 27, 2022; https://www.zhinst.com/others/en/blogs/rf-reflectometry-measurements-quantum-dots.

Wikipedia, "Phase-shift keying;" Jan. 17, 2022; Accessed Feb. 17, 2022; https://en.wikipedia.org/wiki/Phase-shift_keying.

Wikipedia, "Equivalent impedance transforms;" Last updated Sep. 16, 2019; Accessed Feb. 17, 2022; https://en.wikipedia.org/wiki/Equivalent_impedance_transforms.

Wikipedia, "Impedance matching;" Last updated Feb. 7, 2022; Accessed Feb. 17, 2022; https://en.wikipedia.org/wiki/Impedance_matching.

* cited by examiner

200

QUANTUM COMPUTE DEVICE

202

PROCESSOR

204

MEMORY

206

I/O SUBSYSTEM

208

QUANTUM/CLASSICAL
INTERFACE CIRCUITRY

210

QUANTUM PROCESSOR

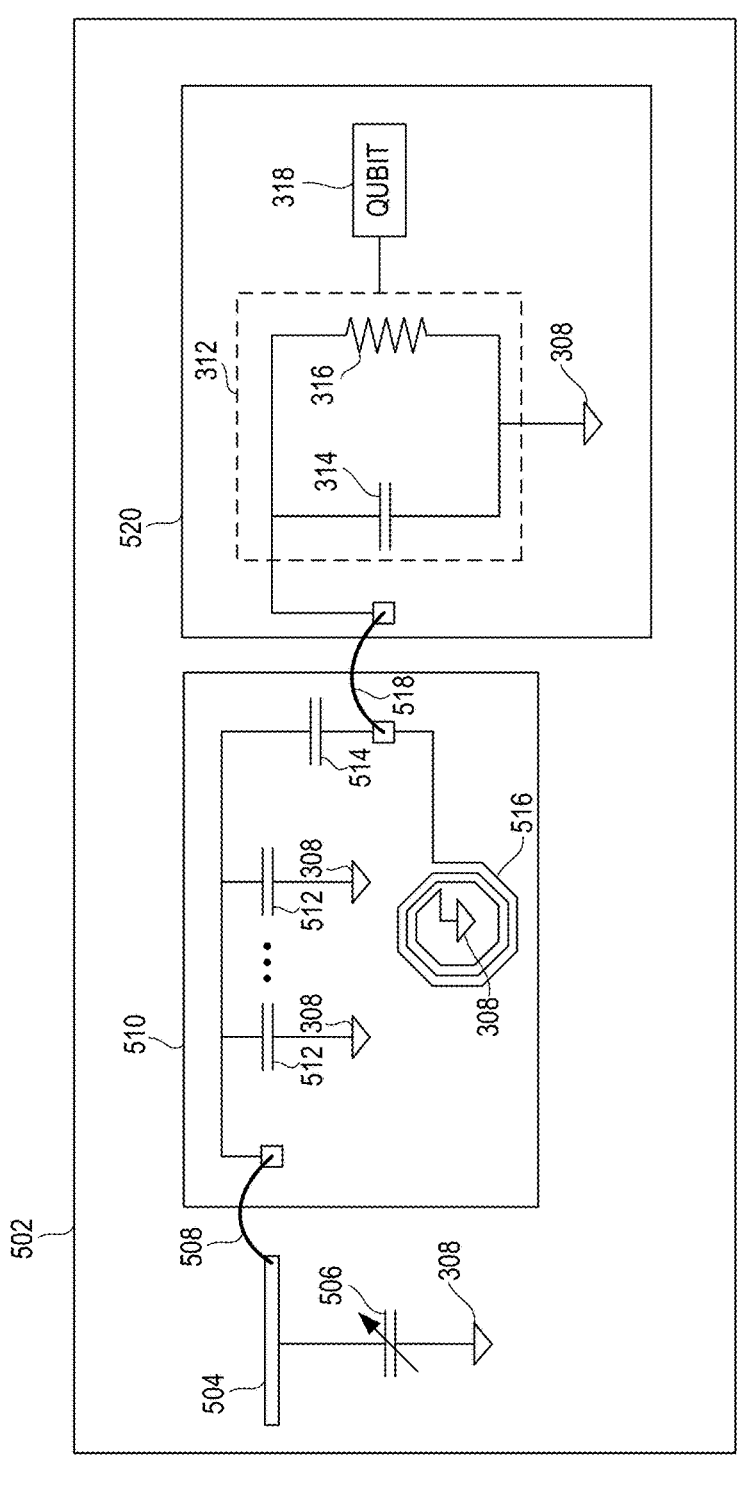

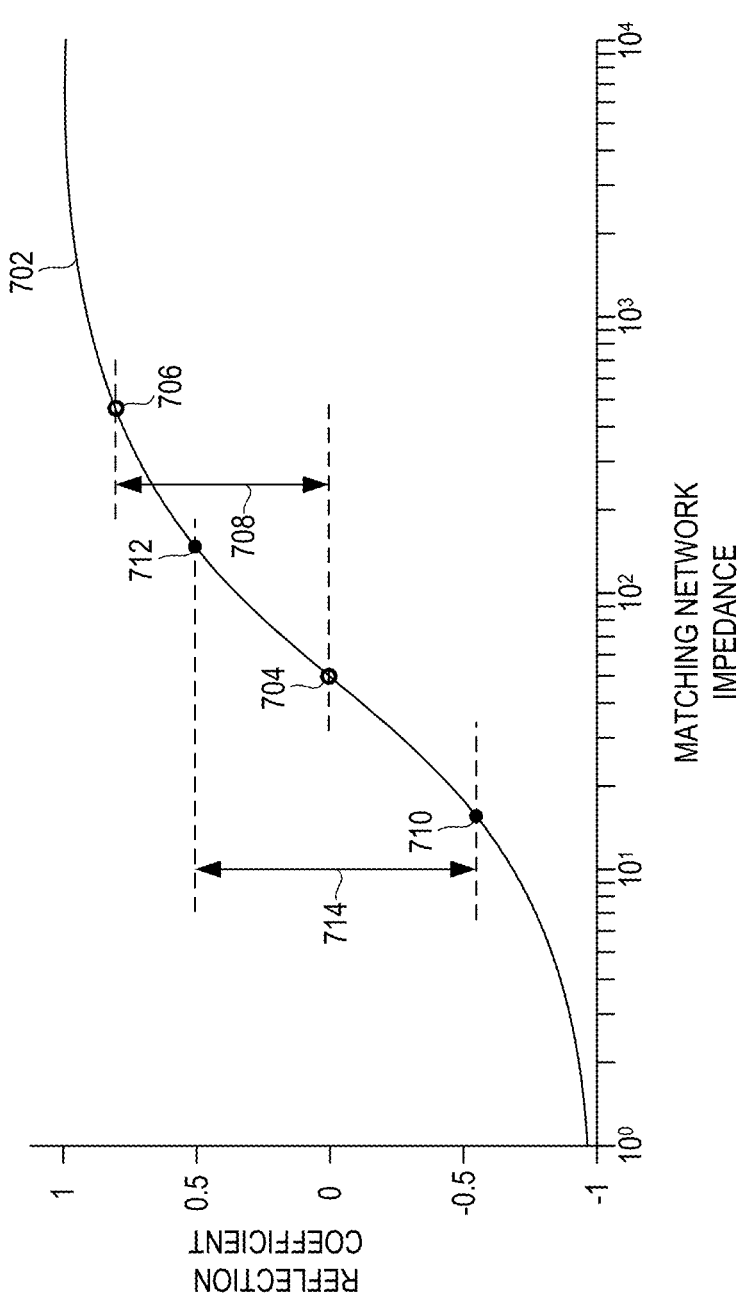
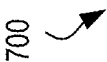
FIG. 7

1100

1102

1102

<u>1500</u>

| PROCESSOR UNIT <u>1502</u> | COMMUNICATION COMPONENT <u>1512</u> |
|---|---|
| MEMORY <u>1504</u> | BATTERY/POWER <u>1514</u> |
| DISPLAY DEVICE <u>1506</u> | GNSS DEVICE <u>1518</u> |
| AUDIO OUTPUT DEVICE <u>1508</u> | AUDIO INPUT DEVICE <u>1524</u> |
| AN OTHER OUTPUT DEVICE <u>1510</u> | AN OTHER INPUT DEVICE <u>1520</u> |

ANTENNA <u>1522</u>

FIG. 15

TECHNOLOGIES FOR IMPEDANCE MATCHING NETWORKS FOR QUBITS

BACKGROUND

Quantum computers promise computational abilities not feasible with classical computing. One of many challenges in quantum computing is high-fidelity measurement of quantum bits (qubits). For spin qubits, radio frequency (RF) reflectometry can be used to read a spin qubit state. An RF signal can be sent to a circuit whose resistance is coupled to the state of the qubit. The reflected signal can be used to sense the state of the qubit.

BRIEF DESCRIPTION OF THE DRAWINGS

FIG. 5 illustrates an example embodiment of the system of FIG. 3 on a circuit board.

FIG. 7 illustrates a plot showing a reflection coefficient as a function of an impedance of one embodiment of the impedance matching network of the system of FIG. 3.

FIG. 15 is a block diagram of an example electrical device, in accordance with any of the embodiments disclosed herein.

DETAILED DESCRIPTION

Figure 1A:
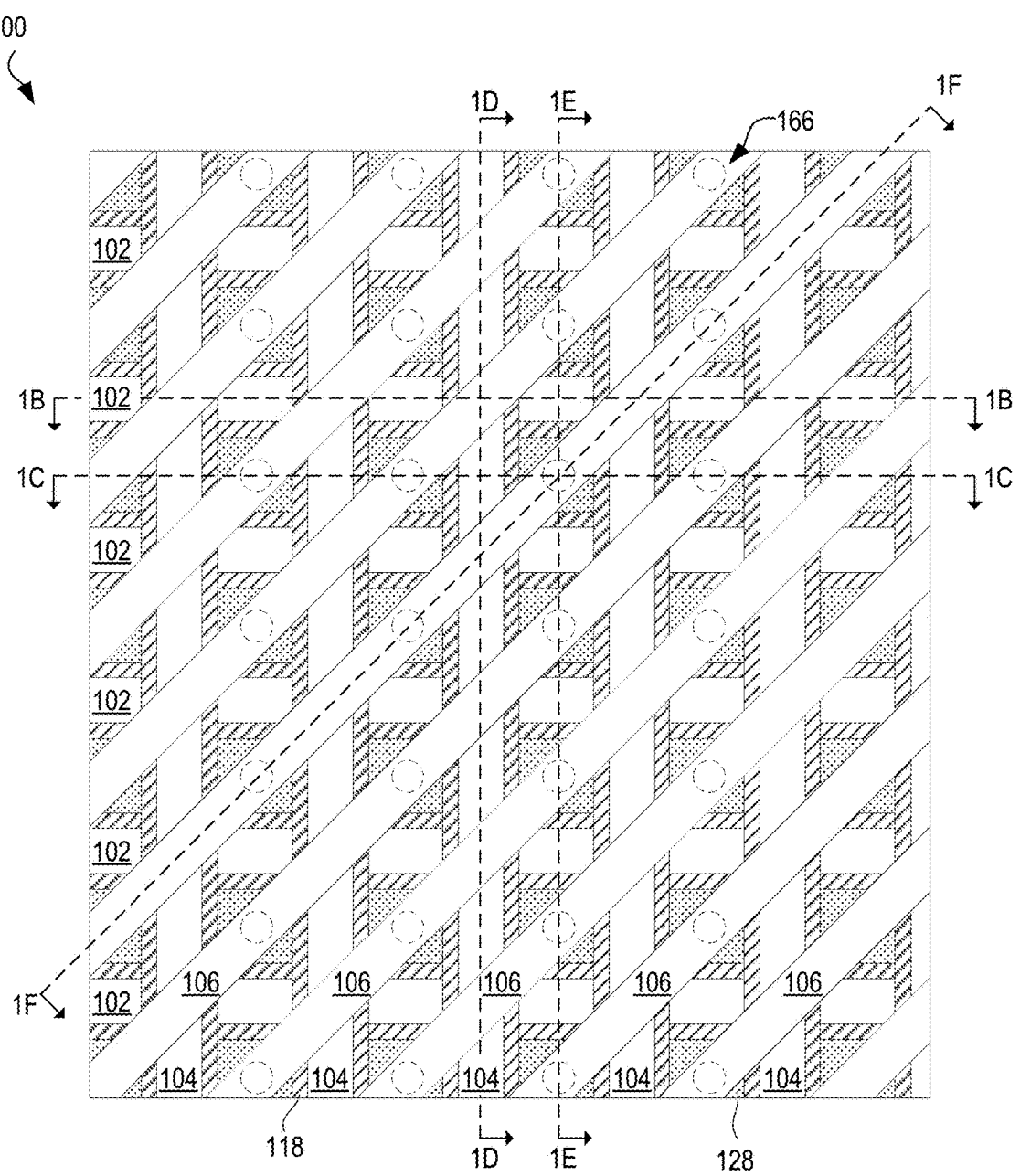
FIGS. 1A-1F illustrate various views of an example quantum dot device, in accordance with one embodiment.

Aspects of the present disclosure may include an impedance matching network coupled to a spin qubit in a semiconductor. In the illustrative embodiment, the impedance matching network includes a variable capacitor such as a varactor. The variable capacitor can be tuned to adjust the operating frequency of the impedance matching network. Additionally or alternatively, in some embodiments, the impedance matching network reflects a stimulus signal with a different amplitude and phase, depending on the state of the qubit.

In the following description, specific details are set forth, but embodiments of the technologies described herein may be practiced without these specific details. Well-known circuits, structures, and techniques have not been shown in detail to avoid obscuring an understanding of this description. Phrases such as "an embodiment," "various embodiments," "some embodiments," and the like may include features, structures, or characteristics, but not every embodiment necessarily includes the particular features, structures, or characteristics.

In the following description, for purposes of explanation, numerous specific details are set forth in order to provide a thorough understanding thereof. It may be evident, however, that the novel embodiments can be practiced without these specific details. In other instances, well-known structures and devices are shown in block diagram form in order to facilitate a description thereof. The intention is to cover all modifications, equivalents, and alternatives within the scope of the claims.

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or any other manner. "Connected" may indicate elements are in direct physical or electrical contact, and "coupled" may indicate elements co-operate or interact, but they may or may not be in direct physical or electrical contact. Furthermore, the terms "comprising," "including," "having," and the like, as used with respect to embodiments of the present disclosure, are synonymous. Terms modified by the word "substantially" include arrangements, orientations, spacings, or positions that vary slightly from the meaning of the unmodified term. For example, a substrate assembly feature, such as a through width, that is described as having substantially a listed dimension can vary within a few percent of the listed dimension.

As used herein, the phrase "communicatively coupled" refers to the ability of a component to send a signal to or receive a signal from another component. The signal can be any type of signal, such as an input signal, an output signal, or a power signal. A component can send or receive a signal to another component to which it is communicatively coupled via a wired or wireless communication medium (e.g., conductive traces, conductive contacts, air). Examples of components that are communicatively coupled include integrated circuit dies located in the same package that communicate via an embedded bridge in a package substrate and an integrated circuit component attached to a printed circuit board that send signals to or receives signals from other integrated circuit components or electronic devices attached to the printed circuit board.

It will be understood that in the examples shown and described further below, the figures may not be drawn to scale and may not include all possible layers and/or circuit components. In addition, it will be understood that although certain figures illustrate transistor designs with source/drain regions, electrodes, etc. having orthogonal (e.g., perpendicular) boundaries, embodiments herein may implement such boundaries in a substantially orthogonal manner (e.g., within +/−5 or 10 degrees of orthogonality) due to fabrication methods used to create such devices or for other reasons.

As used herein, the phrase "located on" in the context of a first layer or component located on a second layer or component refers to the first layer or component being directly physically attached to the second part or component (no layers or components between the first and second layers or components) or physically attached to the second layer or component with one or more intervening layers or components.

As used herein, the term "adjacent" refers to layers or components that are in physical contact with each other. That is, there is no layer or component between the stated adjacent layers or components. For example, a layer X that is adjacent to a layer Y refers to a layer that is in physical contact with layer Y.

As used herein, the terms "upper"/"lower" or "above"/"below" may refer to relative locations of an object (e.g., the surfaces described above), especially in light of examples shown in the attached figures, rather than an absolute location of an object. For example, an upper surface of an apparatus may be on an opposite side of the apparatus from a lower surface of the object, and the upper surface may be facing upward generally only when viewed in a particular way. As another example, a first object above a second object may be on or near an "upper" surface of the second object rather than near a "lower" surface of the object, and the first object may be truly above the second object only when the two objects are viewed in a particular way.

References are made to the drawings, which are not necessarily drawn to scale, wherein similar or same numbers may be used to designate the same or similar parts in different figures. The use of similar or same numbers in different figures does not mean all figures including similar or same numbers constitute a single or same embodiment. Like numerals having different letter suffixes may represent different instances of similar components. The drawings illustrate generally, by way of example, but not by way of limitation, various embodiments discussed in the present document.

A quantum computer uses quantum-mechanical phenomena such as superposition and entanglement to perform computations, simulations, or other functions. In contrast to digital computers, which store data in one of two definite states (0 or 1), quantum computation uses quantum bits (qubits), which can be in superpositions of states. Qubits may be implemented using physically distinguishable quantum states of elementary particles such as electrons and photons. For example, the polarization of a photon may be used where the two states are vertical polarization and horizontal polarization. Similarly, the spin of an electron may have distinguishable states such as "up spin" and "down spin." Qubits in quantum mechanical systems can be in a superposition of both states at the same time, a trait that is unique and fundamental to quantum computing.

Quantum computing systems execute algorithms containing quantum logic operations performed on qubits. In some cases, the result of the algorithm is not deterministic. The quantum algorithm may be repeated many times in order to determine a statistical distribution of results or in order to have a high likelihood of finding the correct answer. In some cases, a classical algorithm may be used to check if the quantum computer determined the correct result.

Qubits have been implemented using a variety of different technologies which are capable of manipulating and reading quantum states. These include but are not limited to quantum dot devices (spin based and spatial based), trapped-ion devices, superconducting quantum computers, optical lattices, nuclear magnetic resonance computers, solid-state NMR Kane quantum devices, electrons-on-helium quantum computers, cavity quantum electrodynamics (CQED) devices, molecular magnet computers, and fullerene-based ESR quantum computers, to name a few. Thus, while a quantum dot device is described below in relation to certain embodiments of the invention, the underlying principles of the invention may be employed in combination with any type of quantum computer, including, but not limited to, those listed above. The particular physical implementation used for qubits is not necessarily required for the embodiments of the invention described herein.

Quantum dots are small semiconductor particles, typically a few nanometers in size. Because of this small size, quantum dots operate according to the rules of quantum mechanics, having optical and electronic properties which differ from macroscopic entities. Quantum dots are sometimes referred to as "artificial atoms" to connote the fact that a quantum dot is a single object with discrete, bound electronic states, as is the case with atoms or molecules.

Figures 1B, 1C:
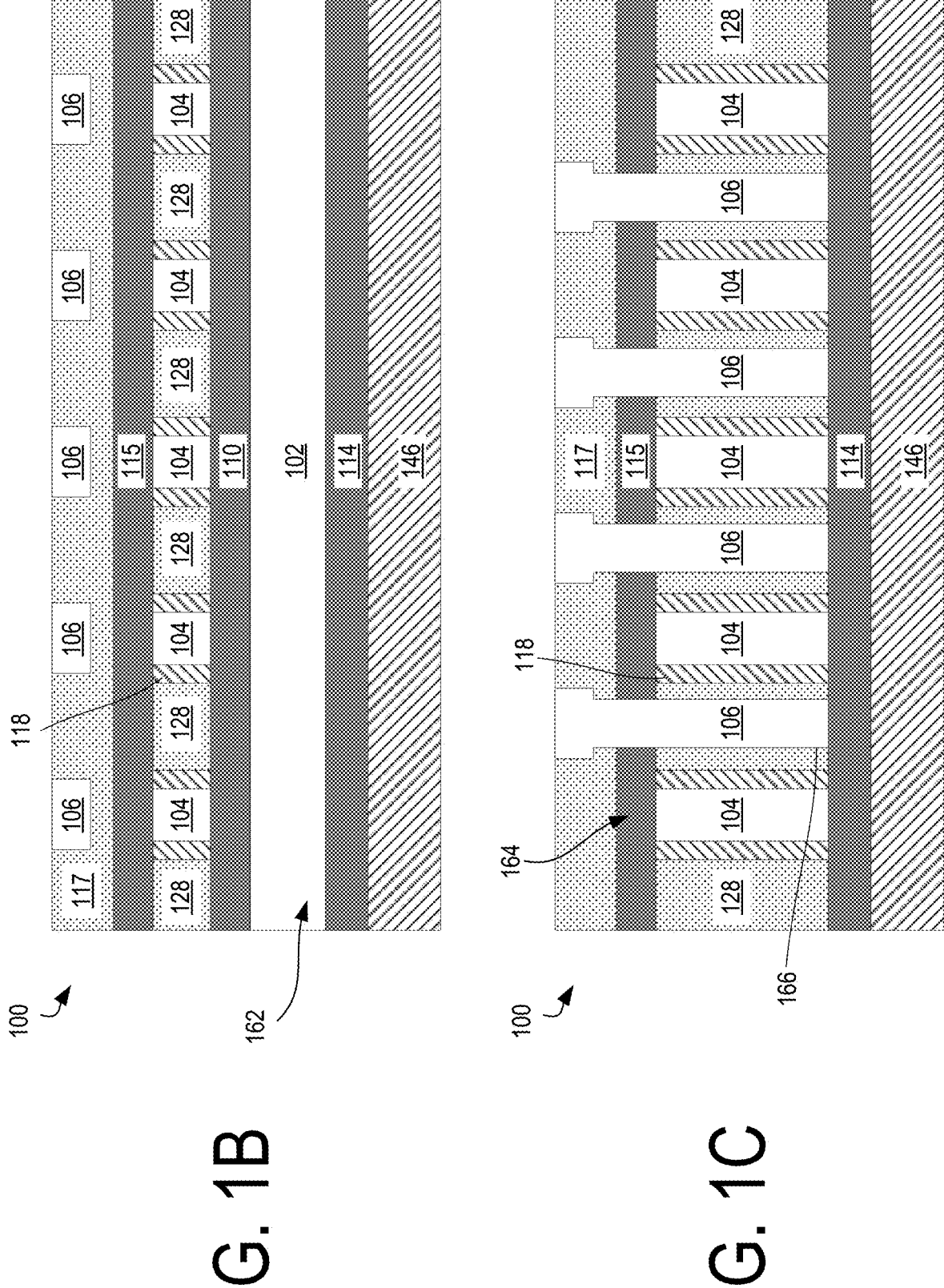
Figures 1D, 1E:
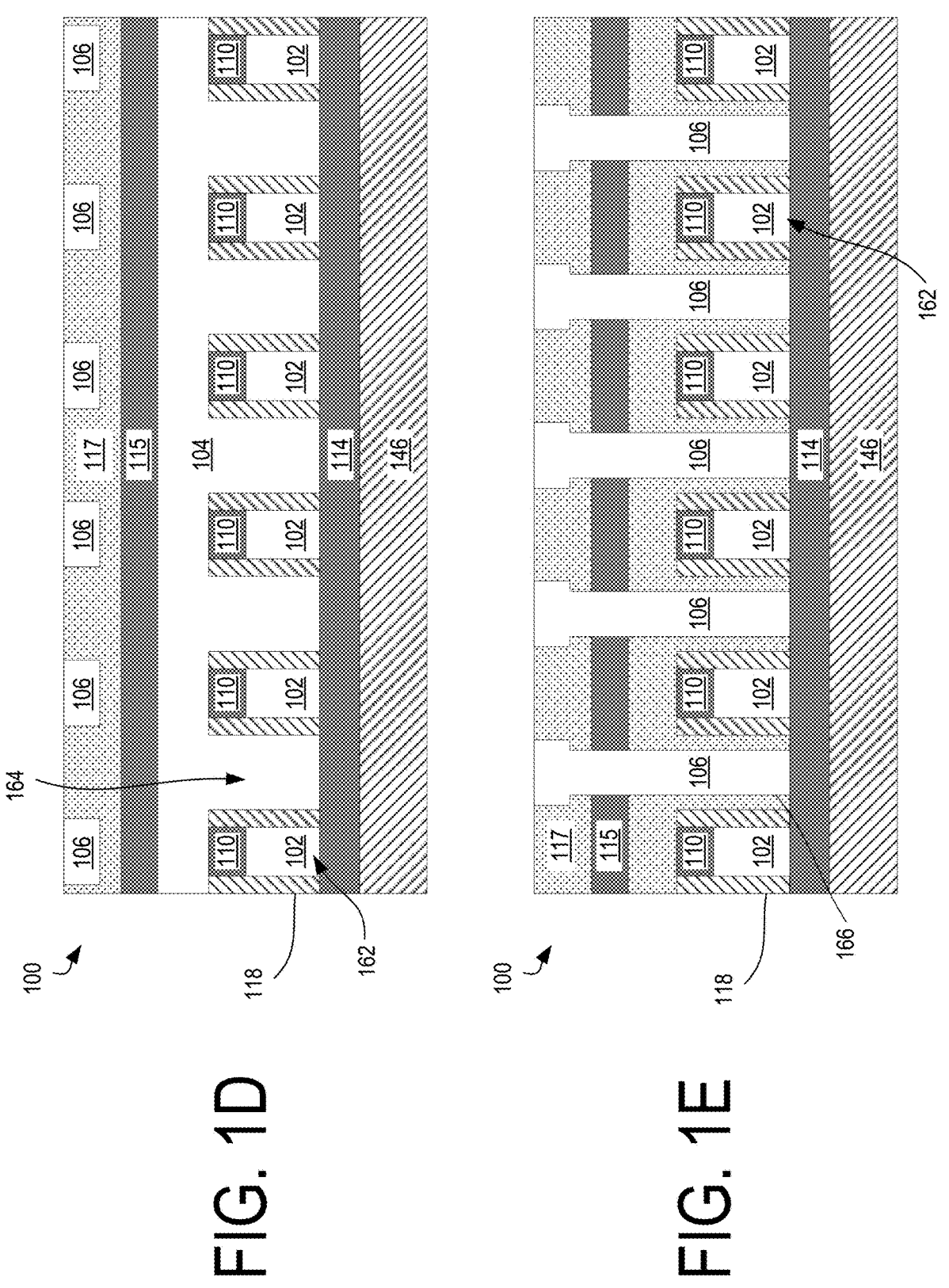
Figure 1F:
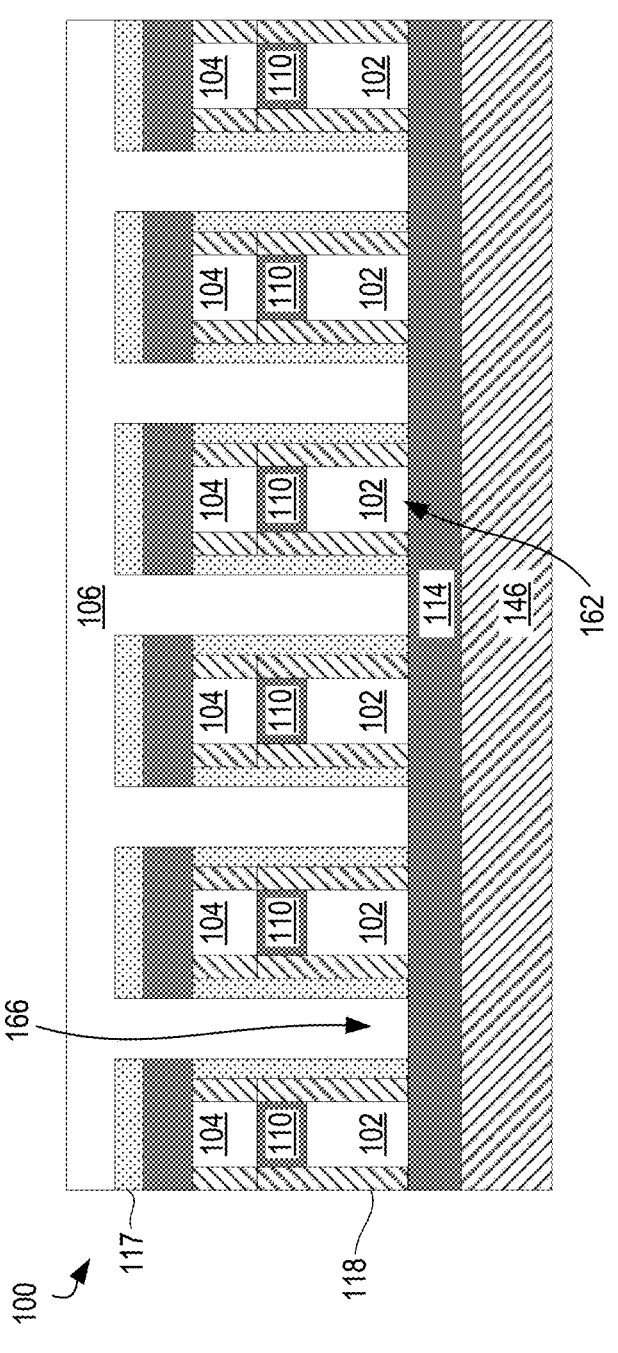

FIGS. 1A-1F are various views of a quantum dot device 100, which may be used with embodiments of the invention described below. FIG. 1A is a top view of a portion of the quantum dot device 100 with some of the materials removed so that the first gate lines 102, the second gate lines 104, and the third gate lines 106 are visible. Although many of the drawings and description herein may refer to a particular set of lines or gates as "barrier" or "quantum dot" lines or gates, respectively, this is simply for ease of discussion, and in other embodiments, the role of "barrier" and "quantum dot" lines and gates may be switched (e.g., barrier gates may instead act as quantum dot gates, and vice versa). FIGS. 1B-1F are side cross-sectional views of the quantum dot device 100 of FIG. 1A; in particular, FIG. 1B is a view through the section B-B of FIG. 1A, FIG. 1C is a view through the section C-C of FIG. 1A, FIG. 1D is a view through the section D-D of FIG. 1A, FIG. 1E is a view through the section E-E of FIG. 1A, and FIG. 1F is a view through the section F-F of FIG. 1A.

The quantum dot device 100 of FIG. 1 may be operated in any of a number of ways. For example, in some embodiments, electrical signals such as voltages, currents, radio frequency (RF), and/or microwave signals, may be provided to one or more first gate line 102, second gate line 104, and/or third gate line 106 to cause a quantum dot (e.g., an electron spin-based quantum dot or a hole spin-based quantum dot) to form in a quantum well stack 146 under a third gate 166 of a third gate line 106. Electrical signals provided to a third gate line 106 may control the electrical potential of a quantum well under the third gates 166 of that third gate line 106, while electrical signals provided to a first gate line 102 (and/or a second gate line 104) may control the potential energy barrier under the first gates 162 of that first gate line 102 (and/or the second gates 164 of that second gate line 104) between adjacent quantum wells. Quantum interactions between quantum dots in different quantum wells in the quantum well stack 146 (e.g., under different quantum dot gates) may be controlled in part by the potential energy barrier provided by the barrier potentials imposed between them (e.g., by intervening barrier gates).

Generally, the quantum dot devices 100 disclosed herein may further include a source of magnetic fields (not shown) that may be used to create an energy difference in the states of a quantum dot (e.g., the spin states of an electron spin-based quantum dot) that are normally degenerate, and the states of the quantum dots (e.g., the spin states) may be manipulated by applying electromagnetic energy to the gates lines to create quantum bits capable of computation. The source of magnetic fields may be one or more magnet lines. Thus, the quantum dot devices 100 disclosed herein may, through controlled application of electromagnetic energy, be able to manipulate the position, number, and quantum state (e.g., spin) of quantum dots in the quantum well stack 146.

In the quantum dot device 100 of FIG. 1, a gate dielectric 114 may be disposed on a quantum well stack 146. A quantum well stack 146 may include at least one quantum well layer (not shown in FIG. 1) in which quantum dots may be localized during operation of the quantum dot device 100. The gate dielectric 114 may be any suitable material, such as a high-k material. Multiple parallel first gate lines 102 may be disposed on the gate dielectric 114, and spacer material 118 may be disposed on side faces of the first gate lines 102. In some embodiments, a patterned hardmask 110 may be disposed on the first gate lines 102 (with the pattern corresponding to the pattern of the first gate lines 102), and the spacer material 118 may extend up the sides of the hardmask 110, as shown. The first gate lines 102 may each be a first gate 162. Different ones of the first gate lines 102 may be electrically controlled in any desired combination (e.g., each first gate line 102 may be separately electrically controlled, or some or all the first gate lines 102 may be shorted together in one or more groups, as desired).

Multiple parallel second gate lines 104 may be disposed over and between the first gate lines 102. As illustrated in FIG. 1, the second gate lines 104 may be arranged perpendicular to the first gate lines 102. The second gate lines 104 may extend over the hardmask 110, and may include second gates 164 that extend down toward the quantum well stack 146 and contact the gate dielectric 114 between adjacent ones of the first gate lines 102, as illustrated in FIG. 1D. In some embodiments, the second gates 164 may fill the area between adjacent ones of the first gate lines 102/spacer material 118 structures; in other embodiments, an insulating material (not shown) may be present between the first gate lines 102/spacer material 118 structures and the proximate second gates 164. In some embodiments, spacer material 118 may be disposed on side faces of the second gate lines 104; in other embodiments, no spacer material 118 may be disposed on side faces of the second gate lines 104. In some embodiments, a hardmask 115 may be disposed above the second gate lines 104. Multiple ones of the second gates 164 of a second gate line 104 are electrically continuous (due to the shared conductive material of the second gate line 104 over the hardmask 110). Different ones of the second gate lines 104 may be electrically controlled in any desired combination (e.g., each second gate line 104 may be separately electrically controlled, or some or all the second gate lines 104 may be shorted together in one or more groups, as desired). Together, the first gate lines 102 and the second gate lines 104 may form a grid, as depicted in FIG. 1.

Multiple parallel third gate lines 106 may be disposed over and between the first gate lines 102 and the second gate lines 104. As illustrated in FIG. 1, the third gate lines 106 may be arranged diagonal to the first gate lines 102, and diagonal to the second gate lines 104. In particular, the third gate lines 106 may be arranged diagonally over the openings in the grid formed by the first gate lines 102 and the second gate lines 104. The third gate lines 106 may include third gates 166 that extend down to the gate dielectric 114 in the openings in the grid formed by the first gate lines 102 and the second gate lines 104; thus, each third gate 166 may be bordered by two different first gate lines 102 and two different second gate lines 104. In some embodiments, the third gates 166 may be bordered by insulating material 128; in other embodiments, the third gates 166 may fill the openings in the grid (e.g., contacting the spacer material 118 disposed on side faces of the adjacent first gate lines 102 and the second gate lines 104, not shown). Additional insulating material 117 may be disposed on and/or around the third gate lines 106. Multiple ones of the third gates 166 of a third gate line 106 are electrically continuous (due to the shared conductive material of the third gate line 106 over the first gate lines 102 and the second gate lines 104). Different ones of the third gate lines 106 may be electrically controlled in any desired combination (e.g., each third gate line 106 may be separately electrically controlled, or some or all the third gate lines 106 may be shorted together in one or more groups, as desired).

Although FIGS. 1A-F illustrate a particular number of first gate lines 102, second gate lines 104, and third gate lines 106, this is simply for illustrative purposes, and any number of first gate lines 102, second gate lines 104, and third gate lines 106 may be included in a quantum dot device 100. Other examples of arrangements of first gate lines 102, second gate lines 104, and third gate lines 106 are possible. Electrical interconnects (e.g., vias and conductive lines) may contact the first gate lines 102, second gate lines 104, and third gate lines 106 in any desired manner.

Not illustrated in FIG. 1 are accumulation regions that may be electrically coupled to the quantum well layer of the quantum well stack 146 (e.g., laterally proximate to the quantum well layer). The accumulation regions may be spaced apart from the gate lines by a thin layer of an intervening dielectric material. The accumulation regions may be regions in which carriers accumulate (e.g., due to doping, or due to the presence of large electrodes that pull carriers into the quantum well layer), and may serve as reservoirs of carriers that can be selectively drawn into the areas of the quantum well layer under the third gates 166 (e.g., by controlling the voltages on the quantum dot gates, the first gates 162, and the second gates 164) to form carrier-based quantum dots (e.g., electron or hole quantum dots, including a single charge carrier, multiple charge carriers, or no charge carriers). In other embodiments, a quantum dot device 100 may not include lateral accumulation regions, but may instead include doped layers within the quantum well stack 146. These doped layers may provide the carriers to the quantum well layer. Any combination of accumulation regions (e.g., doped or non-doped) or doped layers in a quantum well stack 146 may be used in any of the embodiments of the quantum dot devices 100 disclosed herein.

Figure 2:
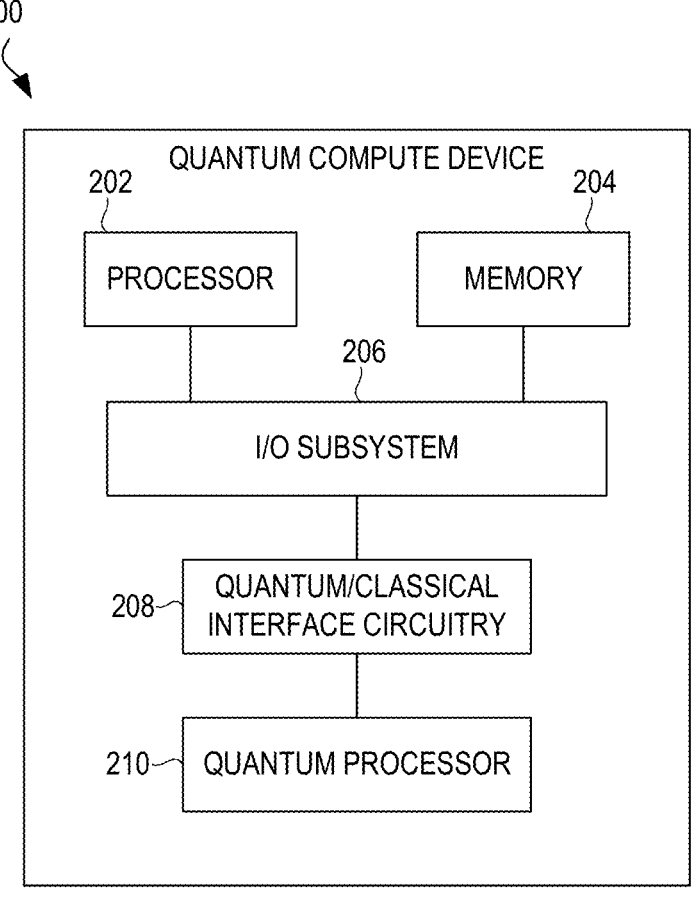
FIG. 2 is a simplified block diagram of at least one embodiment of a quantum compute device.

Referring now to FIG. 2, a simplified block diagram of a quantum compute device 200 is shown. In some embodiments, the quantum compute device 200 may include the quantum dot devices 100 described above in regard to FIGS. 1A-1F. The quantum compute device 200 may be embodied as or included in any type of compute device. For example, the quantum compute device 200 may include or otherwise be included in, without limitation, a server computer, an embedded computing system, a System-on-a-Chip (SoC), a multiprocessor system, a processor-based system, a consumer electronic device, a desktop computer, a laptop computer, a network device, a networked computer, a distributed computing system, and/or any other computing device. The illustrative quantum compute device 200 includes a processor 202, a memory 204, an input/output (I/O) subsystem 206, a quantum/classical interface circuitry 208, and a quantum processor 210. In some embodiments, one or more of the illustrative components of the quantum compute device 200 may be incorporated in, or otherwise form a portion of, another component. For example, the memory 204, or portions thereof, may be incorporated in the processor 202 in some embodiments. In some embodiments, the quantum compute device 200 may be embodied as the electrical device 1500 described below in regard to FIG. 15 or may include any suitable component of the electrical device 1500.

In some embodiments, the quantum compute device 200 may be located in a data center with other compute devices, such as an enterprise data center (e.g., a data center owned and operated by a company and typically located on company premises), managed services data center (e.g., a data center managed by a third party on behalf of a company), a colocated data center (e.g., a data center in which data center infrastructure is provided by the data center host and a company provides and manages their own data center components (servers, etc.)), cloud data center (e.g., a data center operated by a cloud services provider that host companies applications and data), and an edge data center (e.g., a data center, typically having a smaller footprint than other data center types, located close to the geographic area that it serves), a micro data center, etc. In some embodiments, the quantum compute device 200 may receive jobs over a network (such as the Internet) to perform on the quantum processor 210. The quantum compute device 200 may perform the jobs on the quantum processor 210 and send the results back to the requesting device.

The processor 202 may be embodied as any type of processor capable of performing the functions described herein. For example, the processor 202 may be embodied as a single or multi-core processor(s), a single or multi-socket processor, a digital signal processor, a graphics processor, a neural network compute engine, an image processor, a microcontroller, or other processor or processing/controlling circuit. The processor 202 may include multiple processor cores. In some embodiments, the processor 202 supports quantum extensions to an existing ISA of the processor/core 202, allowing instructions that interface with the quantum/classical interface circuitry 208 and the quantum processor 210.

The memory 204 may be embodied as any type of volatile or non-volatile memory or data storage capable of performing the functions described herein. In operation, the memory 204 may store various data and software used during operation of the quantum compute device 200, such as operating systems, applications, programs, libraries, and drivers. The memory 204 is communicatively coupled to the processor 202 via the I/O subsystem 206, which may be embodied as circuitry and/or components to facilitate input/output operations with the processor 202, the memory 204, and other components of the quantum compute device 200. For example, the I/O subsystem 206 may be embodied as, or otherwise include, memory controller hubs, input/output control hubs, firmware devices, communication links (e.g., point-to-point links, bus links, wires, cables, light guides, printed circuit board traces, etc.) and/or other components and subsystems to facilitate the input/output operations. The I/O subsystem 206 may connect various internal and external components of the quantum compute device 200 to each other with use of any suitable connector, interconnect, bus, protocol, etc., such as an SoC fabric, PCIe®, USB2, USB3, USB4, NVMe®, Thunderbolt®, Compute Express Link (CXL), and/or the like. In some embodiments, the I/O subsystem 206 may form a portion of a system-on-a-chip (SoC) and be incorporated, along with the processor 202 and the memory 204 and other components of the quantum compute device 200 on a single integrated circuit chip.

The quantum/classical interface circuitry 208 is configured to interface with both classical components of the quantum compute device 200, such as the processor 202 and memory 204, as well as the quantum processor 210. The quantum/classical interface circuitry 208 may include a variety of analog or digital circuitry, such as analog-to-digital converters, digital-to-analog converters, high gain amplifiers, low noise amplifiers, cryogenic amplifiers, field-programmable gate arrays (FPGAs), classical processors, application-specific integrated circuits (ASICs), signal conditioning circuitry, etc. In some embodiments, some or all of the quantum/classical interface circuitry 208 may be inside of a refrigerator, such as a dilution refrigerator, a magnetic refrigerator, a helium-4 and/or helium-3 refrigerator, etc. Some or all of the components of the quantum/classical interface circuitry 208 may be at any suitable temperature, such as 10 millikelvin, 100 millikelvin, 4 Kelvin, 20 Kelvin, 77 Kelvin, room temperature or above, or anywhere in between.

The quantum processor 210 is configured to operate one or more qubits. The qubits may be any suitable type of qubit, such as a quantum dot spin qubit described above in regard to FIGS. 1A-1F. In other embodiments, the qubits may be, e.g., charge qubits, transmon qubits, microwave qubits, superconducting qubits, or any other suitable type of qubits. The quantum processor 210 may include any suitable number of physical or logical qubits, such as $1-10^6$. In the illustrative embodiment, some or all of the quantum processor 210 is in a refrigerator such as a dilution refrigerator. In particular, in the illustrative embodiment, the qubits are held at a temperature of about 10 millikelvin. In other embodiments, the qubits may be held at any suitable temperature, such as 1-100 millikelvin or higher, depending on the temperature sensitivity of the particular qubit in use.

The quantum processor 210 may be able to control the various qubits in various ways, such as by performing two-qubit gates, three-qubit gates, error correction operations, transferring a state from one type of qubit to another, measuring some, any or, all of the qubits, initializing some, any, or all of the qubits, etc.

The quantum compute device 200 may include additional components not shown in FIG. 2, such as one or more data storage devices, a network interface controller, one or more peripheral devices, etc.

Figure 3:
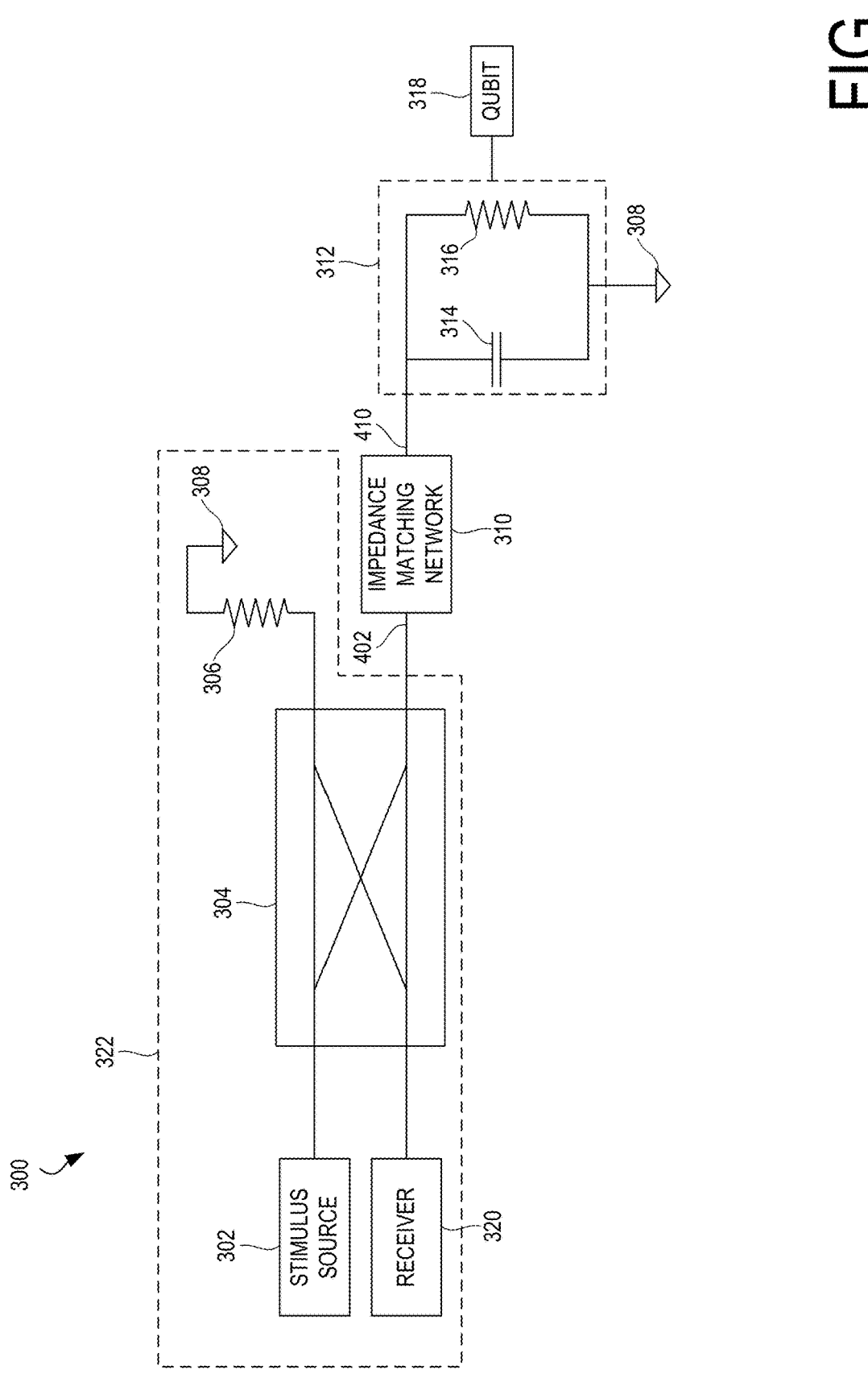
FIG. 3 illustrates an example system with an impedance matching network for reading a state of a qubit.

Referring now to FIG. 3, in one embodiment, a system 300 includes a stimulus source 302 connected to a hybrid coupler 304. One port of the hybrid coupler 304 is connected to a terminator made up of a resistor 306 coupled to a ground 308. A second port of the hybrid coupler 304 is connected to an impedance matching network 310. The impedance matching network 310 is also coupled to a single-electron transistor 312, represented as a capacitor 314 and a resistor 316 connected in parallel between the impedance matching network 310 and the ground 308. The resistance of the single-electron transistor 312 depends on a state of a qubit 318. The remaining port of the hybrid coupler 304 is connected to a receiver 320. Together, the stimulus source 302, the hybrid coupler 304, the terminator including the resistor 306, and the receiver 320 form a measurement network 322 at a first impedance. The impedance matching network 310 can convert between the impedance of the measurement network 322 and the impedance of the single-electron transistor 312.

In use, the stimulus source 302 generates a radio-frequency (RF) signal, such as a 500 MHz signal. The RF signal is sent over a transmission line to the hybrid coupler 304, which splits the RF signal, sending it to the terminator that includes the resistor 306 and to the impedance matching network 310. The impedance matching network 310 matches the relatively low impedance of the stimulus source 302, hybrid coupler 304, receiver 320, and connecting transmission lines to the relatively high impedance of the single-electron transistor 312.

In the illustrative embodiment, the single-electron transistor 312 has a resistance represented by the resistor 316 that depends on the state of the qubit 318. For example, in one embodiment, if the qubit 318 is in a zero state (e.g., spin down), then the resistance of the resistor 316 may be 100 kΩ), and if the qubit 318 is in a one state (e.g., spin up), then the resistance of the resistor 316 may be 105 kΩ). As discussed in more detail below, the resistance of the resistor 316 may increase only temporarily when the qubit 318 is measured to be in a spin up state.

In the illustrative embodiment, the impedance matching network 310 is configured to match the impedance of the measurement network 322 to the impedance of the single-electron transistor 312 in the low-impedance state (e.g., when the resistance of the resistor 316 is 100 kΩ), in the example above). As such, when the single-electron transistor 312 is in the low-impedance state, the signal from the stimulus source 302 will be almost completely absorbed. When the single-electron transistor 312 is in the high-impedance state, a significant portion of the signal sent from the stimulus source 302 will be reflected back to the hybrid coupler 304 and to the receiver 320. As discussed in more detail below in regard to FIG. 4, the illustrative impedance matching network 310 can be tuned for a particular impedance matching ratio at a particular stimulus frequency.

The stimulus source 302 may be any suitable RF source. The stimulus source 302 may create an RF pulse at any suitable wavelength, bandwidth, envelope, amplitude, etc. In the illustrative embodiment, the stimulus source 302 creates a pulse with a rectangular envelope with a frequency of 500 MHz. In other embodiments, a different envelope such as a Gaussian may be used, and/or a different radio frequency may be used, such as 50-50,000 MHz.

In the illustrative embodiment, the coupler 304 is a hybrid coupler 304 that evenly splits the power of the RF signal between the two output ports (i.e., to the terminator with the resistor 306 and to the impedance matching network 310). In other embodiments, the coupler 304 may be a different type of coupler, such as a directional coupler with a splitting other than 50/50. In some embodiments, a circulator may be used in place of a coupler 304.

In the illustrative embodiment, the characteristic impedance of components in the measurement network 322 (such as transmission lines connecting various components, the hybrid coupler 304, etc.) is 50 Ohms. In other embodiments, the characteristic impedance of components in the measurement network 322 may be a different impedance, such as 40-200 Ohms.

The single-electron transistor 312 may be any suitable single-electron transistor, such as a single-electron transistor based on a semiconductor quantum dot. As used herein, a single-electron transistor includes few-electron transistors and does not necessarily operate in the single electron regime unless explicitly stated otherwise, despite the name. In the illustrative embodiment, the single-electron transistor 312 operates in the regime of approximately 100 electrons. In some embodiments, the single-electron transistor 312 may be replaced with a different qubit In the illustrative embodiment, the qubit 318 is a spin qubit, and the qubit is capacitively coupled to the gate of the single-electron transistor 312. As such, the number of electrons in the qubit 318 affects the voltage on the gate of the single-electron transistor 312. The state of the qubit 318 can be read using an Elzerman readout. When the spin qubit is in a spin up state, the electron that forms the spin qubit 318 can transition out of the qubit 318 temporarily, changing the resistance of the transistor 312 (i.e., the resistance of the resistor 316) for a period of time. The electron can then transition back to the qubit 318 in the spin down state. As such, in the illustrative embodiment, the transistor 312 is only in the high-resistance state for the resistor 316 for only part of the measurement period. For example, in a measurement period of 1 millisecond, the transistor 312 may be in a high-resistance state for 100 microseconds. More generally, for a measurement period of, e.g., 0.1-10 milliseconds, the transistor 312 may be in a high-resistance state for, e.g., 0.1-1,000 microseconds.

In use, in the illustrative embodiment, when the electron of the qubit 318 is in a spin-down state, the resistance of the transistor 312 as represented by the resistor 316 is at a lower resistance value of, e.g., 50-500 kΩ When the electron of the qubit 318 starts in a spin-up state and transitions out of the qubit 318 temporarily, the resistance of the transistor 312 as represented by the resistor 316 is at a higher resistance value of, e.g., 55-500 kΩ. The ratio of the high resistance value to the low resistance value of the resistor 316 may be any suitable value, such as 1.02-50. In the illustrative embodiment, the resistance of the resistor 316 is 100 kΩ and 105 kΩ at the low-resistance and high-resistance values, respectively.

In the illustrative embodiment, the system 300 includes a single-electron transistor 312 coupled to a spin qubit 318. More generally, it should be appreciated that the system 300 may include any suitable component in place of the single-electron transistor 312 whose impedance depends on the state of the qubit 318, which may be any suitable type of qubit.

The receiver 320 may be any suitable receiver capable of measuring the signal from the stimulus source 302 that is reflected from the single-electron transistor 312. For example, the receiver 320 may be embodied as an RF power meter, a network analyzer, a spectrum analyzer, etc. The receiver 320 may include one or more amplifiers, mixers, or other components. In some embodiments, the receiver 320 may include one or more IQ mixers and/or other components in order to measure both the in-phase and quadrature components of the reflected signal.

In the illustrative embodiment, some or all of the components of the system 300 may be in a cryogenic refrigerator. For example, the qubit 318, single-electron transistor 312, and/or the impedance matching network 310 may be held at, e.g., 10 millikelvin. The stimulus source 302 and/or the receiver 320 may be at a higher temperature region of the refrigerator (such as a 4 Kelvin region or may be outside of the refrigerator.

In the illustrative embodiment, the quantum/classical interface circuitry 208 or other control circuitry includes or otherwise interfaces with the stimulus source 302 and/or the receiver 320. In the illustrative embodiment, the quantum/classical interface circuitry 208 includes the measurement network 322. The quantum/classical interface circuitry 208 can control, e.g., the frequency, pulse width, amplitude, etc., of pulses from the stimulus source 302. The quantum/classical interface circuitry 208 may determine parameters of the pulse to generate based on, e.g., measured parameters of the measurement network 322, the impedance matching network 310, and/or the single-electron transistor 312.

Figure 4:
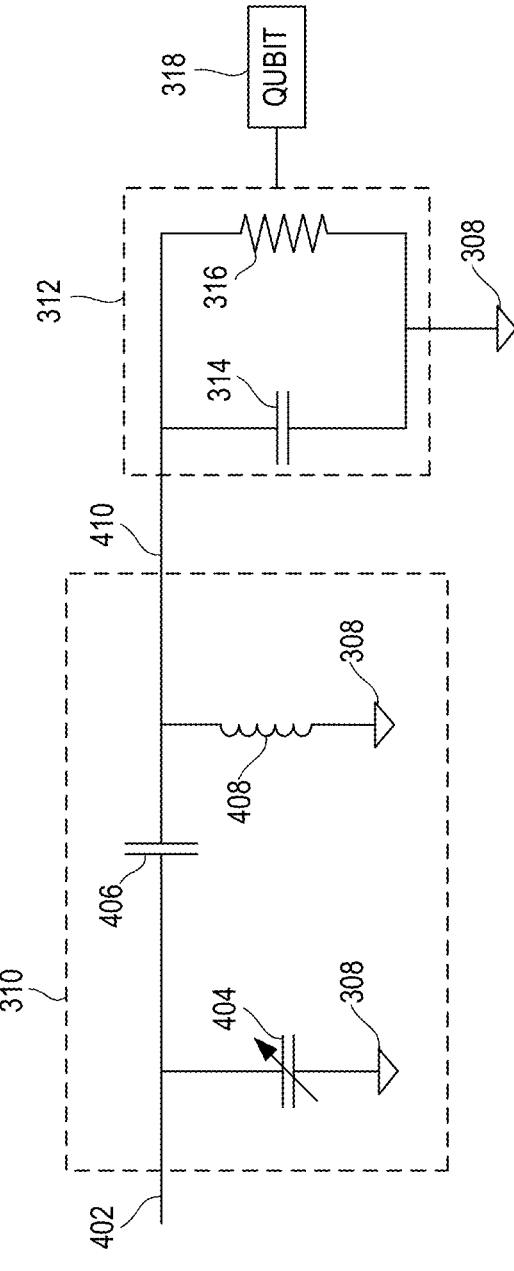
FIG. 4 illustrates an example embodiment of the impedance matching network of FIG. 3.

Referring now to FIG. 4, in one embodiment, a circuit diagram of the impedance matching network 310 is shown. In the illustrative embodiment, a variable capacitor 404 (such as a varactor 404) is connected between an input 402 of the impedance matching network 310 and ground 308. A capacitor 406 is between the input 402 and the output 410 of the impedance matching network 310. An inductor is between the output 410 and ground 308.

The impedance transformation ratio of the impedance matching network 310 shown in FIG. 4 is approximately the square of the ratio of the capacitance of the parallel capacitor 404 ($C_P$) to the capacitance of the series capacitor 406 ($C_S$) (i.e., the impedance matching ratio is $(C_P/C_S)^2$), neglecting the capacitance of the capacitor 314 of the single-electron transistor 312. The matching frequency of the impedance matching network 310 shown in FIG. 4 is $1/\sqrt{LC_{EQ}}$, where $C_{EQ}$ is the equivalent capacitance of the parallel capacitor 404 and the series capacitor 406.

As opposed to a traditional impedance matching network, which may be made up of, e.g., a single inductor between the input 402 and the output 410 (see discussion regarding FIG. 10 below), the impedance matching network 310 shown in FIG. 4 has several advantages. As the impedance transformation ratio is relatively high, $C_P$ is much greater than $C_S$. As a result, $C_{EQ}$ (and, therefore, the matching frequency) is mostly independent of $C_S$, decoupling the impedance transformation ratio and the matching frequency of the impedance matching network 310. For example, in one embodiment, changing the capacitance $C_P$ of the capacitor 404 by, e.g., a factor of two (changing the impedance transformation by about a factor of four), may change the matching frequency by less than 1%, such as 1-0.01%. As the impedance matching ratio of the impedance matching network 310 is high, such as over 1,000, the quality factor (or Q factor) of the series capacitor 406 and the inductor 408 must be high (e.g., over 10,000). However, the parallel capacitor 404 is shorted to the low source impedance of, e.g., 50Ω, relaxing the Q factor required of the parallel capacitor 404 and, therefore, allowing use of an off-the-shelf varactor 404 with a relatively low Q factor for the parallel capacitor 404.

In the illustrative embodiment, the capacitor 404 is a cryogenic varactor with a controllable tuning range of, e.g., 10-100% of a maximum value. The varactor may be controlled by an input voltage (not shown in FIG. 4). In other embodiments, the capacitor 404 may be embodied as any suitable type of variable capacitor. In the illustrative embodiment, the capacitor 404 has a capacitance of, e.g., 5 pF. The capacitor 404 may have any suitable maximum capacitance, such as 1-30 pF. The capacitance of the capacitor 404 may be used to tune the impedance transformation ratio of the impedance matching network 310 in order to, e.g., match the impedance of the measurement network 322 to the impedance of the single-electron transistor 312 in the low-resistance state. In the illustrative embodiment, the Q factor of the capacitor 404 may be relatively low, such as 10-100. In other embodiments, the Q factor of the capacitor 404 may be higher.

In the illustrative embodiment, control circuitry such as quantum/classical interface circuitry 208 is configured to control the capacitance of the capacitor 404. For example, the quantum/classical interface circuitry 208 or other circuitry may measure or otherwise determine the resistance of the single-electron transistor 312 in the high-resistance and low-resistance states. The quantum/classical interface circuitry 208 may control the capacitance of the capacitor 404 based on the resistance of the single-electron transistor 312 in the high-resistance and/or low-resistance states. In other embodiments, the quantum/classical interface circuitry 208 or other control circuitry may control the capacitance of the capacitor 404 based on other parameters, such as a signal reflected from the single-electron transistor 312.

In the illustrative embodiment, the capacitance of the series capacitor 406 is, e.g., 1 pF. In other embodiments, the capacitance of the series capacitor 406 may be any suitable value, such as 0.3-10 pF. In the illustrative embodiment, the capacitor 406 has a relatively high Q factor at an operating temperature and matching frequency of the impedance matching network 310, such as a Q factor of 1,000-50,000. In the illustrative embodiment, the Q factor of the capacitor 406 at an operating temperature of the impedance matching network 310 is over 10,000.

In the illustrative embodiment, the inductance of the inductor 408 is, e.g., 300 nH. In other embodiments, the inductance of the inductor 408 may be any suitable value, such as 50-1,000 nH. In the illustrative embodiment, the inductor 408 has a relatively high Q factor at an operating temperature and matching frequency of the impedance matching network 310, such as a Q factor of 1,000-50,000. In the illustrative embodiment, the Q factor of the inductor 408 at an operating temperature of the impedance matching network 310 is over 10,000.

In the illustrative embodiment, the impedance matching network 310 matches a 50Ω impedance of the measurement network 322 to a 100 kΩ impedance of the single-electron transistor 312 in the low-resistance state, giving an impedance transformation ratio of 2,000. In other embodiments, the impedance transformation ratio may be any suitable value, such as 500 to 10,000.

In the illustrative embodiment, the matching frequency of the impedance matching network 310 is about 500 MHz. In other embodiments, the matching frequency of the impedance matching network 310 may be any suitable value, such as 100-1,000 MHz.

Referring now to FIG. 5, in one embodiment, a physical implementation of the impedance matching network 310 is shown. In the illustrative embodiment, the impedance matching network 310, the single-electron transistor 312, and the qubit 318 are supported on a single printed circuit board 502. The illustrative printed circuit board 502 has a trace 504 on it that a signal from the stimulus source 302 can be coupled. A variable capacitor 506 is coupled to the trace 504. A wire 508 is wire bonded to a pad 509 on a chip 510. The chip 510 includes several parallel capacitors 512, series capacitor 514, and inductor 516. The chip 510 is wire bonded to a chip 520 by a wire 518. The chip 520 includes the single-electron transistor 312 and the qubit 318.

The printed circuit board 502 may be any suitable material, such as FR-4. The printed circuit board 502 may have any suitable width or height, such as a width and/or height of 10-200 millimeters.

The chip 510 may be any suitable chip, such as a silicon-based chip. In the illustrative embodiment, the capacitor 514, inductor 516, and wires between the components of the chip 510 are made of a material that is superconducting at an operating temperature of the impedance matching network 310. For example, the capacitor 514, inductor 516, and wires between the components of the chip 510 may be made of aluminum, niobium, or niobium nitride. The operating temperature of the impedance matching network 310 may be, e.g., 4-0.01 Kelvin. As the resistive loss of the superconducting components is zero, the Q factor of the capacitor 514 and the inductor 516 may be relatively high.

In the illustrative embodiment, an array of N series capacitors 512 on the chip 510 combine with the variable capacitor 506 in series to establish the total serial capacitance, $C_{TS}=N*C_S+C_{VAR}$, where $C_{TS}$ is the total series capacitance, $C_S$ is the capacitance of capacitors 512, and $C_{VAR}$ is the capacitance of the variable capacitor 506. The capacitance of the capacitors 512 is fixed (i.e., not variable). In the illustrative embodiment, the capacitance of series capacitor 514 is the same as that of the parallel capacitors 512, giving an impedance transformation ratio of $((N*C_S+C_{VAR})/C_S)^2$, which simplifies to approximately $N^2$ when $C_{VAR}$ is neglected. N may be any suitable value, such as 1-100. The values of $C_S$ and the maximum value of $C_{VAR}$ may be selected so that a capacitor 506 that can have a capacitance of 10%-100% of its maximum value can tune the impedance transformation ratio by, e.g., a factor of three. For example, in one embodiment, the capacitor 506 may be able to tune the impedance transformation ratio between 2,000 and 6,000.

In the illustrative embodiment, control of the parallel capacitance is based on changes to the variable capacitor 506. Additionally or alternatively, in some embodiments, the connections to each capacitor 512 may be able to be controlled digitally, such as by the presence of a transistor in series with each capacitor 512 (not shown in FIG. 5). In the illustrative embodiment, the variable capacitor 506 is a varactor that is off of the chip 510. In other embodiments, the variable capacitor 506 may be on the chip 510, with or without the fixed capacitors 512.

In the embodiment shown in FIG. 5, the components are on the printed circuit board 502, a first chip 510, and a second chip 520. In other embodiments, the components may be together on, e.g., a single chip with the qubit 318. It should be appreciated that the printed circuit board 502, the chip 510, and/or the chip 520 may include additional components now shown. For example, the chip 520 may include more than one qubit, some or all of which may have a separate impedance matching network 310, single-electron transistor 312, etc.

Figure 6:
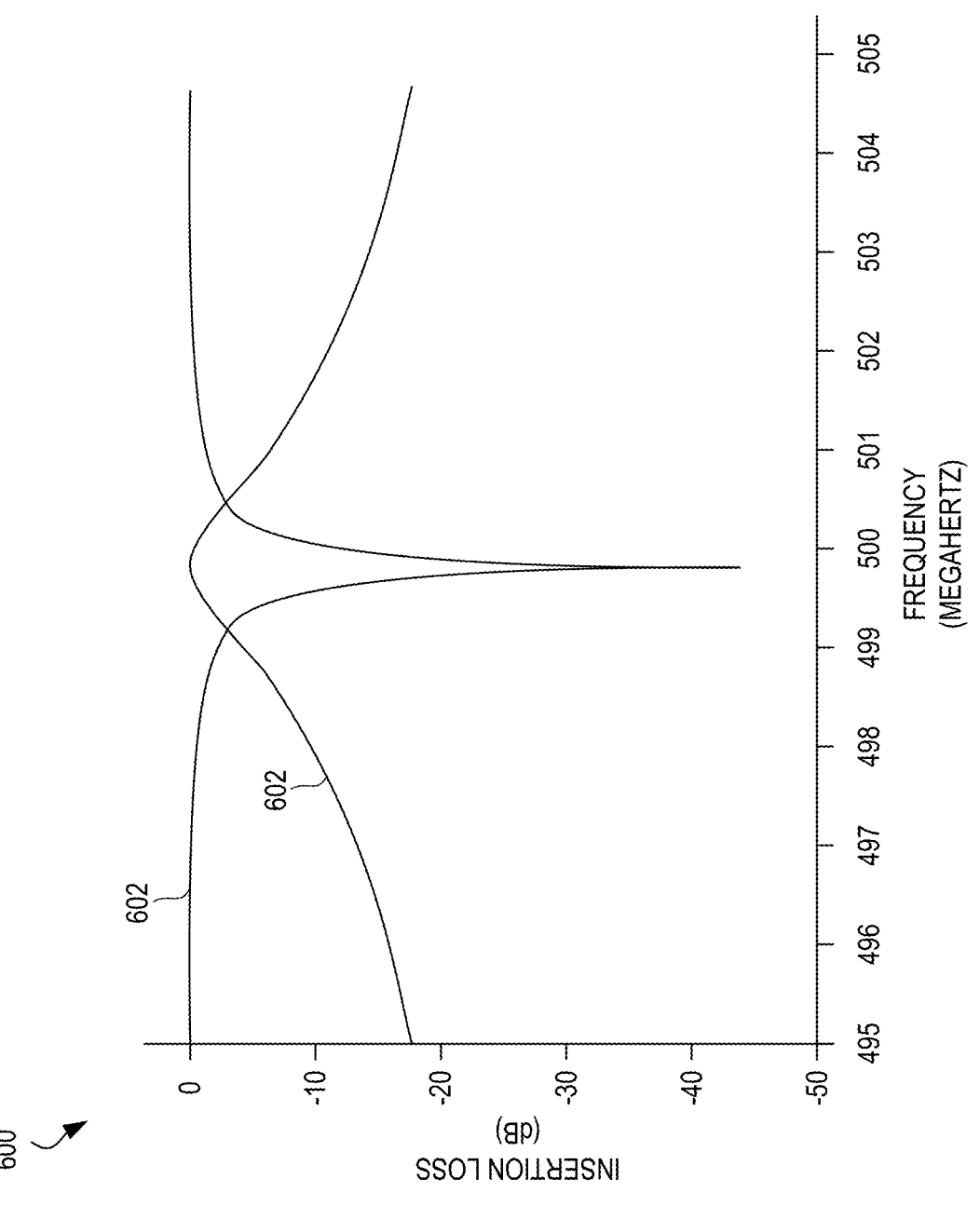
FIG. 6 illustrates a plot showing insertion loss of the impedance matching network of one embodiment of the system of FIG. 3.

Referring now to FIG. 6, in one embodiment, a plot 600 shows a simulation of the signal 602 reflected from the impedance matching network 310, and a simulation of the signal 604 that passes through the impedance matching network 310. In the embodiment shown, the matching frequency of the impedance matching network 310 is slightly less than 500 MHz, at about 499.8 MHz. As shown in the plot, at the matching frequency, the signal is attenuated by over 40 dB (i.e., less than 0.01% of the signal is reflected). In other embodiments, slightly more signal may be reflected when the impedance is matched at the matching frequency, such as 0.01-1% of the incoming signal.

In an illustrative embodiment described above, the impedance matching network 310 matches the impedance of the measurement network 322 to the impedance of the single-electron transistor 312 in the low-resistance state, such that the RF signal will be almost completely absorbed by the single-electron transistor 312 when in the low-resistance state. Such an approach allows for a fairly simple measurement scheme of, e.g., setting a threshold for the reflected power received at the receiver 320 in order to differentiate between the states of the single-electron transistor 312 and, therefore, the states of the qubit 318. However, in other embodiments, other approaches may be used.

Referring now to FIG. 7, the reflection coefficient of the impedance matching network 310 is shown as a function of the impedance looking into the impedance matching network 310. The reflection coefficient from the impedance matching network 310 is given by the equation $\gamma=(Z_L-50)/(Z_L+50)$, where $\gamma$ is the reflection coefficient, $Z_L$ is the impedance looking into the impedance matching network

310 and that converts the single-electron transistor 312 impedance, and 50 is the characteristic impedance of the measurement network 322.

In an embodiment in which the impedance matching network 310 matches the impedance of the measurement network 322 to the impedance of the single-electron transistor 312 in the low-resistance state, the impedance looking into the impedance matching network 310 will be 50Ω, matching the impedance measurement network 322, resulting in a reflection coefficient of about zero, as indicated by the point 704. For example, the impedance matching network 310 may have an impedance matching ratio of 2,000, matching a 50Ω of the measurement network 322 to the 100 kΩ resistance of the single-electron transistor 312 in the low-resistance state. Keeping the parameters of the impedance matching network 310 the same but increasing the resistance of the resistor 316 of the single-electron transistor 312 from 100 kΩ to 1 MΩ shifts the impedance $Z_L$, looking into the impedance matching network 310 from 50Ω to approximately 500Ω, giving a reflection coefficient of about 0.8, as indicated by the point 706. The signal differential 708 between point 706 and point 704 is then 0.8.

In a different embodiment, the impedance matching network 310 is configured to have a lower impedance than the measurement network 322 when the single-electron transistor 312 is in the low-resistance state and a higher impedance than the measurement network 322 when the single-electron transistor 312 is in the high-resistance state. For example, in one embodiment, the impedance matching network 310 may have an impedance matching ratio of about 6,300. When coupled to the single-electron transistor 312 with a resistance of 100 kΩ, the resulting impedance of the impedance matching network 310 and the single-electron transistor 312 is about 16Ω, giving a reflection coefficient of about −0.52, as shown by point 710 on the plot 700. When coupled to the single-electron transistor 312 with a resistance of 1 MΩ, the resulting impedance of the impedance matching network 310 and the single-electron transistor 312 is about 160Ω, giving a reflection coefficient of about 0.52, as shown by point 712 on the plot 700. The resulting signal differential 714 between point 710 and point 712 is then 1.04, significantly higher than the signal differential 708 between points 704 and 706.

It should be appreciated that, in the illustrative embodiment, the reflection coefficients from the impedance matching network 310 at the two resistance states of the transistor 312 have approximately equal magnitude at opposite phases. As a result, a power measurement will not detect the difference between the states. In such embodiments, a phase-sensitive measurement must be used, such as one that uses one or more IQ mixers and/or other components in order to measure both the in-phase and quadrature components of the reflected signal.

Figure 8:
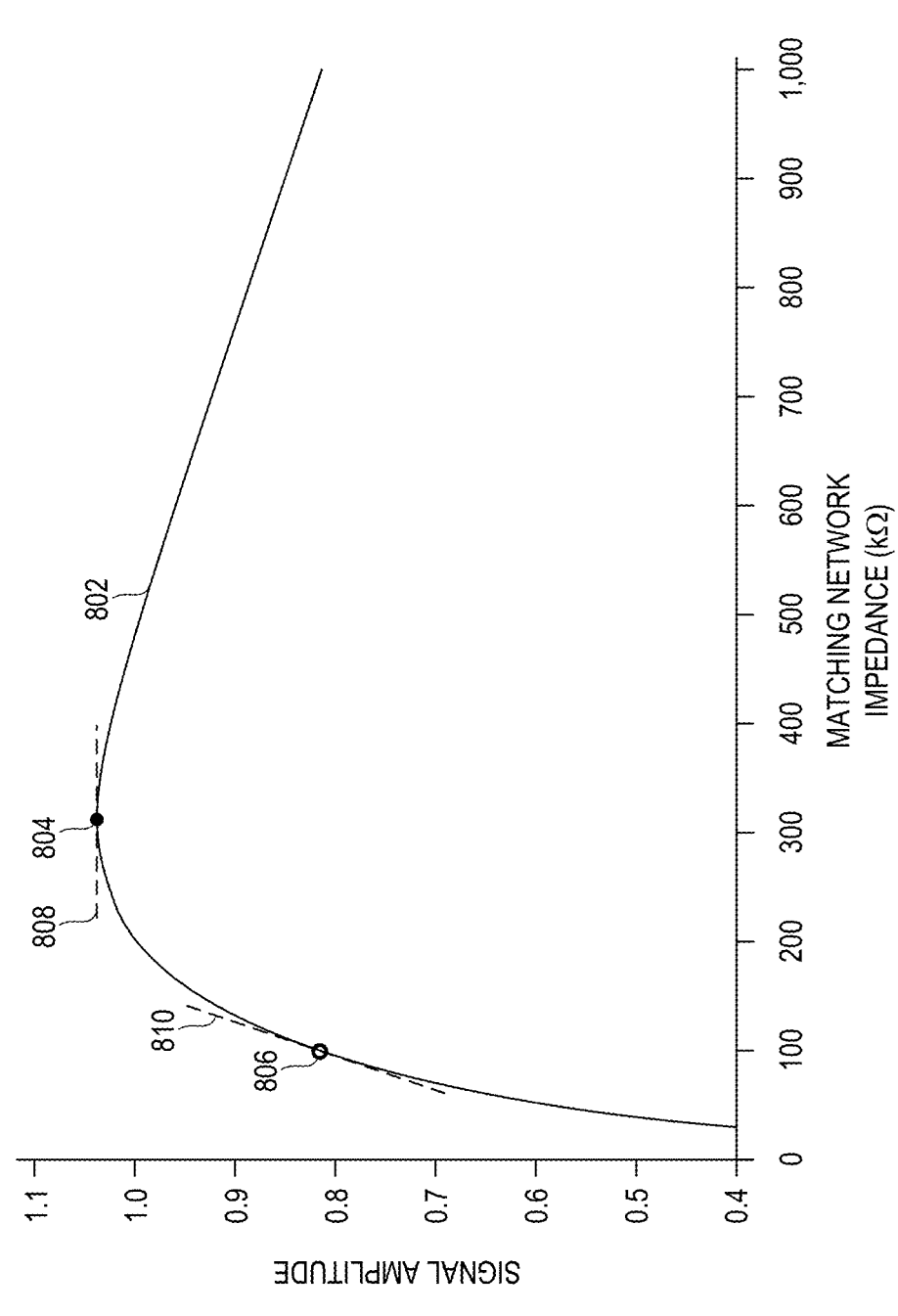
FIG. 8 illustrates a plot showing a signal amplitude as a function of an impedance of one embodiment of the impedance matching network of the system of FIG. 3.

Referring now to FIG. 8, a plot 800 shows a signal differential amplitude 802 as a function of the impedance of the impedance matching network 310. The signal differential amplitude represents the difference between the reflection coefficient at the low-resistance state of the single-electron transistor 312 and the reflection coefficient at the high-resistance state of the single-electron transistor 312. Point 806 corresponds to differential 708 in FIG. 7. As shown in FIG. 8, the tangent 810 to the point 806 is relatively high, indicating a high sensitivity of the signal differential amplitude to the impedance of the impedance matching network 310. As a result, relatively small variations in the impedance of the impedance matching network 310 leads to relatively large variations in the signal differential amplitude, making the system corresponding to point 806 relatively sensitive to various manufacturing or operational fluctuations of the system.

Point 804 corresponds to differential 714 in FIG. 7. As shown in FIG. 8, the tangent 808 to the point 804 is close to zero, indicating a low sensitivity of the signal differential amplitude to the impedance of the impedance matching network 310. As a result, relatively large variations in the impedance of the impedance matching network 310 leads to relatively small variations in the signal differential amplitude, making the system corresponding to point 804 relatively insensitive to various manufacturing or operational fluctuations of the system, as well as making the system more sensitive due to the higher amplitude of the signal differential.

Figure 9:
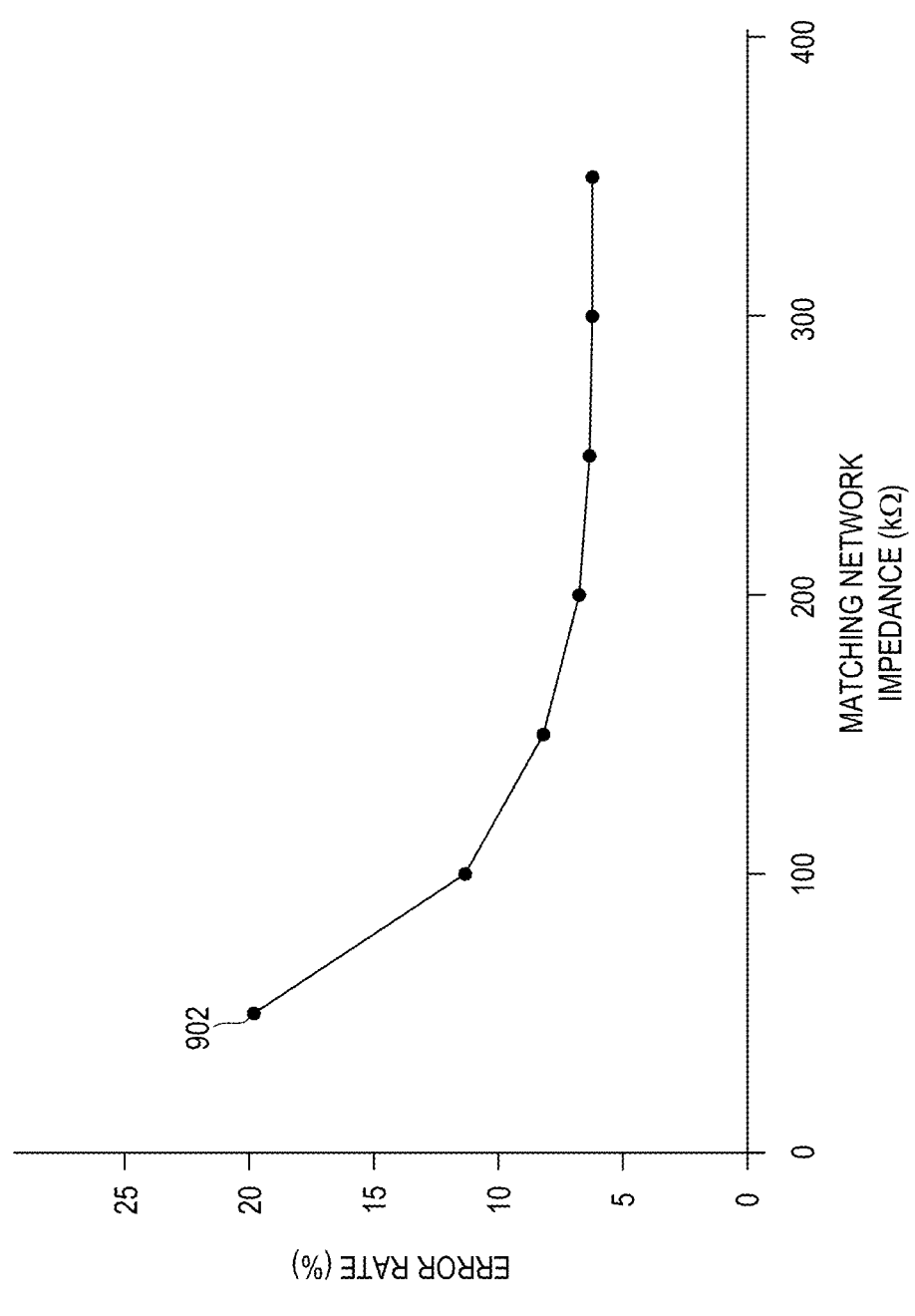
FIG. 9 illustrates a plot showing a measurement error rate as a function of an impedance of one embodiment of the impedance matching network of the system of FIG. 3.

Referring now to FIG. 9, in one embodiment, a plot 900 shows an error rate 902 as a function of the matched impedance of the impedance matching network 310. A given value on the x-axis corresponds to an impedance of the single-electron transistor 312 that is matched to 50Ω. The plot 900 is for a single-electron transistor 312 with a low resistance of 100 kΩ and a high resistance of 1 MΩ As shown in FIG. 9, the error rate 902 is higher at a matched impedance of, e.g., 100 kΩ compared to a matched impedance of, e.g., 300 kΩ.

The illustrative embodiments described above in regard to FIGS. 7-9 have a shift in impedance of the single-electron transistor 312 from 100 kΩ to 1 MΩ (i.e., the impedance increases by a factor of 10). However, it should be appreciated that the same technique can be used for any suitable shift in impedance, such as 1.02-50. In some embodiments, the resistance of the single-electron transistor 312 may shift from 100 kΩ to 105 kΩ.

Figure 10:
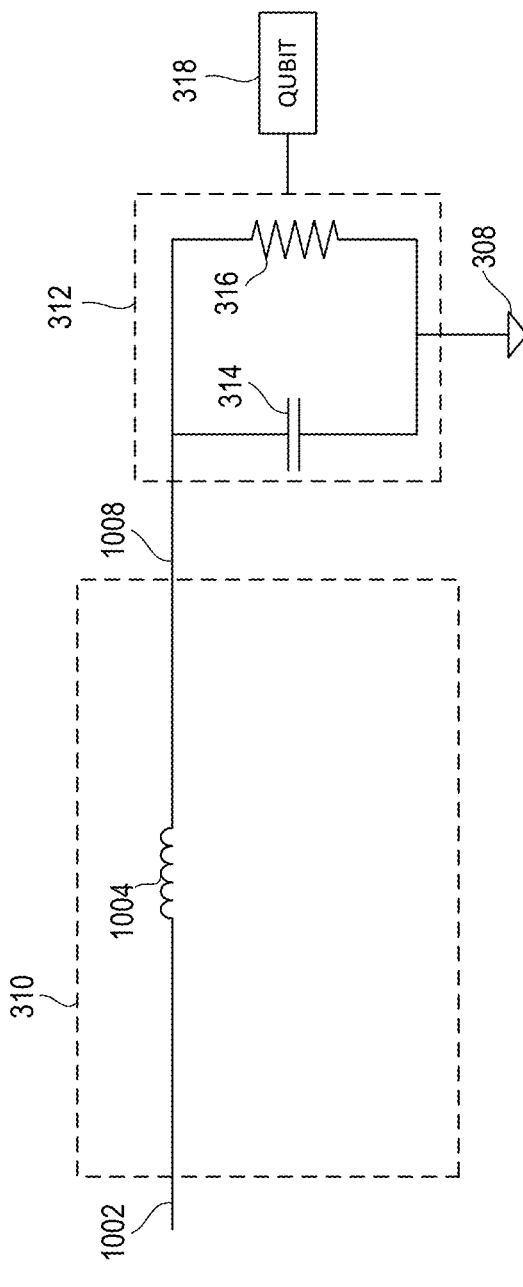
FIG. 10 illustrates an example embodiment of the impedance matching network of FIG. 3.

Referring now to FIG. 10, it should be appreciated that, in some embodiments, an impedance matching network 310 other than the one shown in FIG. 4 may be used. For example, in some embodiments, an impedance matching network 310 that includes an inductor 1004 connected between an input 1002 and an output 1006 may be used. Although such an impedance matching network 310 does not have certain benefits such as tunability that the impedance matching network 310 of FIG. 4 does, the impedance matching network 310 shown in FIG. 10 can be tuned to match an impedance higher than that of the single-electron transistor 312 to the measurement network 322, similar to the embodiments described in regard to FIGS. 7-9.

Figure 11:
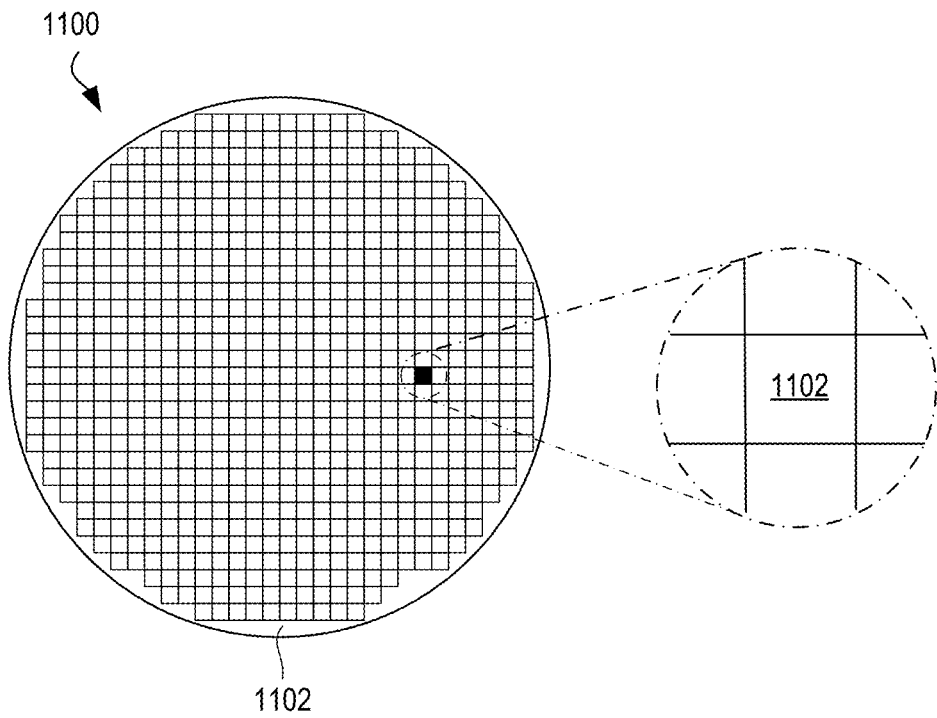
FIG. 11 is a top view of a wafer and dies, in accordance with any of the embodiments disclosed herein.

FIG. 11 is a top view of a wafer 1100 and dies 1102 that may be included in any of the chips 510, 520 disclosed herein. The wafer 1100 may be composed of semiconductor material and may include one or more dies 1102 having integrated circuit structures formed on a surface of the wafer 1100. The individual dies 1102 may be a repeating unit of an integrated circuit product that includes any suitable integrated circuit. After the fabrication of the semiconductor product is complete, the wafer 1100 may undergo a singulation process in which the dies 1102 are separated from one another to provide discrete "chips" of the integrated circuit product. The die 1102 may be any of the chips 510, 520. The die 1102 may include one or more transistors (e.g., some of the transistors 1240 of FIG. 12, discussed below), supporting circuitry to route electrical signals to the transistors, passive components (e.g., signal traces, resistors, capacitors, or inductors), and/or any other integrated circuit components. In some embodiments, the wafer 1100 or the die 1102 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1102. For example, a memory array formed by multiple memory devices may be formed on a same die 1102 as a processor unit (e.g., the processor unit 1502 of FIG. 15) or other logic that is configured to store information in the memory devices or execute instructions stored in the memory array. Various ones of the chips 510, 520 disclosed herein may be manufactured using a die-to-wafer assembly technique in which some chips 510, 520 are attached to a wafer 1100 that include others of the chips 510, 520, and the wafer 1100 is subsequently singulated.

Figure 12:
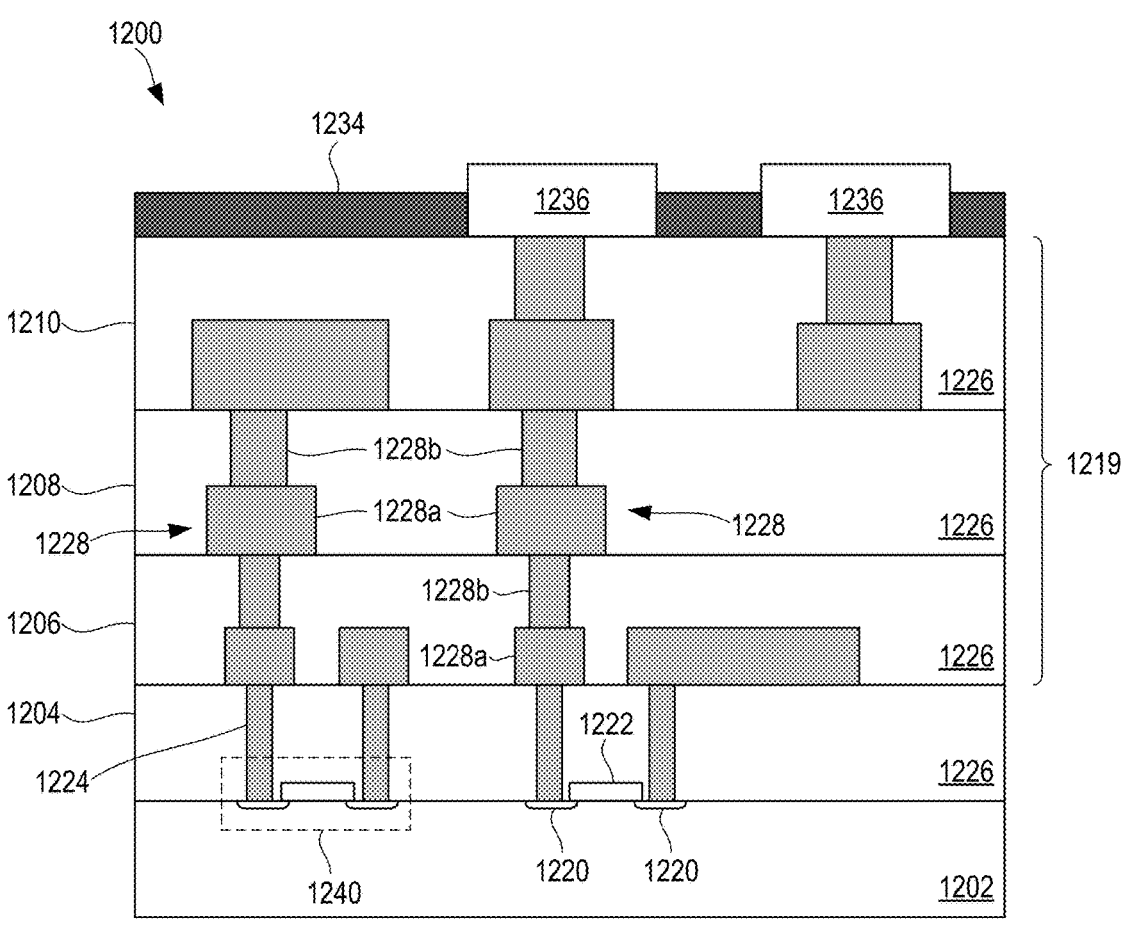
FIG. 12 is a cross-sectional side view of an integrated circuit, in accordance with any of the embodiments disclosed herein.

FIG. 12 is a cross-sectional side view of an integrated circuit device 1200 that may be included in any of the chips 510, 520 disclosed herein. One or more of the integrated circuit devices 1200 may be included in one or more dies 1102 (FIG. 11). The integrated circuit device 1200 may be formed on a die substrate 1202 (e.g., the wafer 1100 of FIG. 11) and may be included in a die (e.g., the die 1102 of FIG. 11). The die substrate 1202 may be a semiconductor substrate composed of semiconductor material systems including, for example, n-type or p-type materials systems (or a combination of both). The die substrate 1202 may include, for example, a crystalline substrate formed using a bulk silicon or a silicon-on-insulator (SOI) substructure. In some embodiments, the die substrate 1202 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 1202. Although a few examples of materials from which the die substrate 1202 may be formed are described here, any material that may serve as a foundation for an integrated circuit device 1200 may be used. The die substrate 1202 may be part of a singulated die (e.g., the dies 1102 of FIG. 11) or a wafer (e.g., the wafer 1100 of FIG. 11).

The integrated circuit device 1200 may include one or more device layers 1204 disposed on the die substrate 1202. The device layer 1204 may include features of one or more transistors 1240 (e.g., metal oxide semiconductor field-effect transistors (MOSFETs)) formed on the die substrate 1202. The transistors 1240 may include, for example, one or more source and/or drain (S/D) regions 1220, a gate 1222 to control current flow between the S/D regions 1220, and one or more S/D contacts 1224 to route electrical signals to/from the S/D regions 1220. The transistors 1240 may include additional features not depicted for the sake of clarity, such as device isolation regions, gate contacts, and the like. The transistors 1240 are not limited to the type and configuration depicted in FIG. 12 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon, nanosheet, or nanowire transistors.

FIGS. 13A-13D are simplified perspective views of example planar, FinFET, gate-all-around, and stacked gate-all-around transistors. The transistors illustrated in FIGS. 13A-13D are formed on a substrate 1316 having a surface 1308. Isolation regions 1314 separate the source and drain regions of the transistors from other transistors and from a bulk region 1318 of the substrate 1316.

Figure 13A:
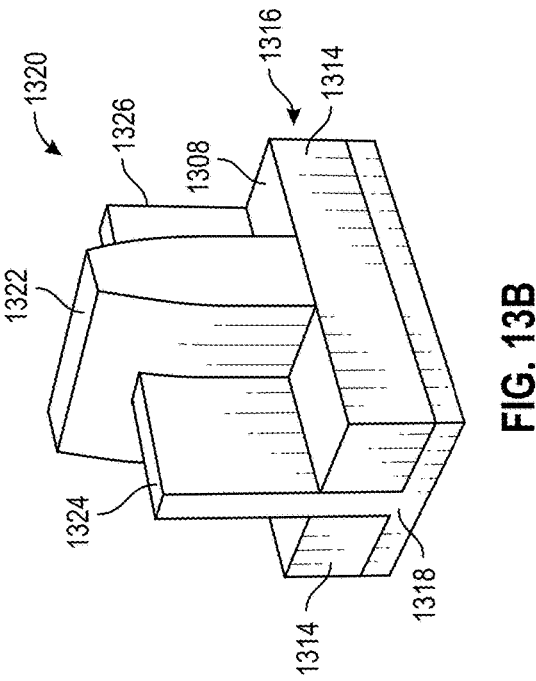
FIGS. 13A-13D are perspective views of example planar, gate-all-around, and stacked gate-all-around transistors.

FIG. 13A is a perspective view of an example planar transistor 1300 comprising a gate 1302 that controls current flow between a source region 1304 and a drain region 1306. The transistor 1300 is planar in that the source region 1304 and the drain region 1306 are planar with respect to the substrate surface 1308.

Figure 13B:
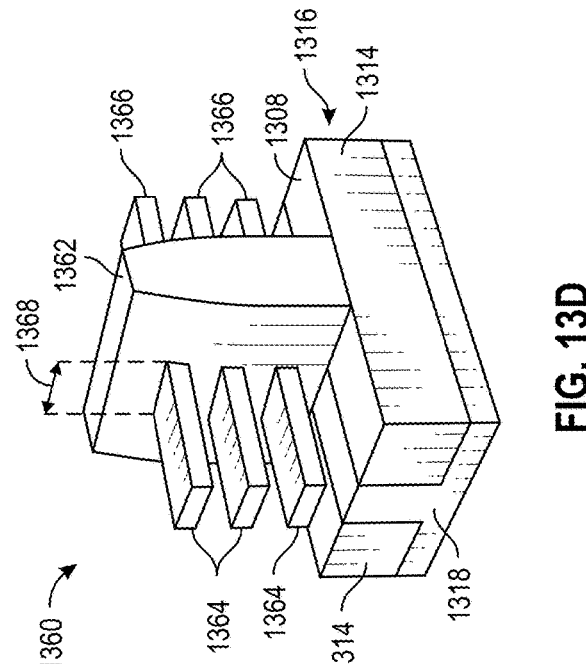

FIG. 13B is a perspective view of an example FinFET transistor 1320 comprising a gate 1322 that controls current flow between a source region 1324 and a drain region 1326. The transistor 1320 is non-planar in that the source region 1324 and the drain region 1326 comprise "fins" that extend upwards from the substrate surface 1328. As the gate 1322 encompasses three sides of the semiconductor fin that extends from the source region 1324 to the drain region 1326, the transistor 1320 can be considered a tri-gate transistor. FIG. 13B illustrates one S/D fin extending through the gate 1322, but multiple S/D fins can extend through the gate of a FinFET transistor.

Figure 13C:
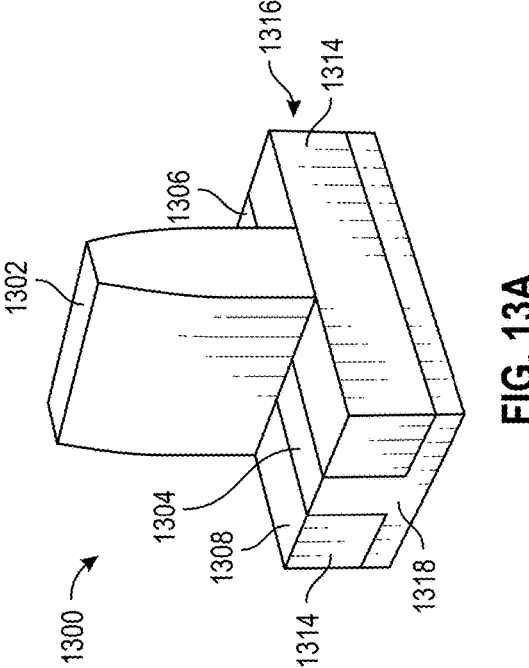

FIG. 13C is a perspective view of a gate-all-around (GAA) transistor 1340 comprising a gate 1342 that controls current flow between a source region 1344 and a drain region 1346. The transistor 1340 is non-planar in that the source region 1344 and the drain region 1346 are elevated from the substrate surface 1328.

Figure 13D:
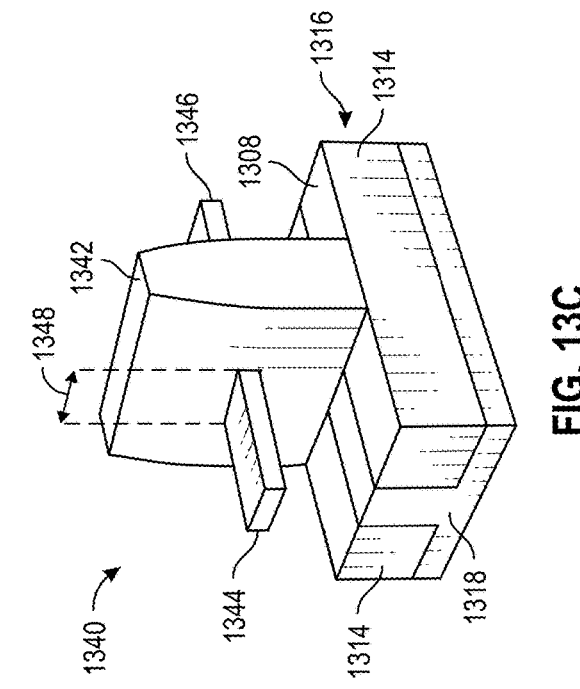

FIG. 13D is a perspective view of a GAA transistor 1360 comprising a gate 1362 that controls current flow between multiple elevated source regions 1364 and multiple elevated drain regions 1366. The transistor 1360 is a stacked GAA transistor as the gate controls the flow of current between multiple elevated S/D regions stacked on top of each other. The transistors 1340 and 1360 are considered gate-all-around transistors as the gates encompass all sides of the semiconductor portions that extends from the source regions to the drain regions. The transistors 1340 and 1360 can alternatively be referred to as nanowire, nanosheet, or nanoribbon transistors depending on the width (e.g., widths 1348 and 1368 of transistors 1340 and 1360, respectively) of the semiconductor portions extending through the gate.

Returning to FIG. 12, a transistor 1240 may include a gate 1222 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1240 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1240 along the source-channel-drain direction, the gate electrode may consist of a U-shaped structure that includes a bottom portion substantially parallel to the surface of the die substrate 1202 and two sidewall portions that are substantially perpendicular to the top surface of the die substrate 1202. In other embodiments, at least one of the metal layers that form the gate electrode may simply be a planar layer that is substantially parallel to the top surface of the die substrate 1202 and does not include sidewall portions substantially perpendicular to the top surface of the die substrate 1202. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1220 may be formed within the die substrate 1202 adjacent to the gate 1222 of individual transistors 1240. The S/D regions 1220 may be formed using an implantation/diffusion process or an etching/deposition process, for example. In the former process, dopants such as boron, aluminum, antimony, phosphorous, or arsenic may be ion-implanted into the die substrate 1202 to form the S/D regions 1220. An annealing process that activates the dopants and causes them to diffuse farther into the die substrate 1202 may follow the ion-implantation process. In the latter process, the die substrate 1202 may first be etched to form recesses at the locations of the S/D regions 1220. An epitaxial deposition process may then be carried out to fill the recesses with material that is used to fabricate the S/D regions 1220. In some implementations, the S/D regions 1220 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1220 may be formed using one or more alternate semiconductor materials such as germanium or a group III-V material or alloy. In further embodiments, one or more layers of metal and/or metal alloys may be used to form the S/D regions 1220.

Electrical signals, such as power and/or input/output (I/O) signals, may be routed to and/or from the devices (e.g., transistors 1240) of the device layer 1204 through one or more interconnect layers disposed on the device layer 1204 (illustrated in FIG. 12 as interconnect layers 1206-1210). For example, electrically conductive features of the device layer 1204 (e.g., the gate 1222 and the S/D contacts 1224) may be electrically coupled with the interconnect structures 1228 of the interconnect layers 1206-1210. The one or more interconnect layers 1206-1210 may form a metallization stack (also referred to as an "ILD stack") 1219 of the integrated circuit device 1200.

The interconnect structures 1228 may be arranged within the interconnect layers 1206-1210 to route electrical signals according to a wide variety of designs; in particular, the arrangement is not limited to the particular configuration of interconnect structures 1228 depicted in FIG. 12. Although a particular number of interconnect layers 1206-1210 is depicted in FIG. 12, embodiments of the present disclosure include integrated circuit devices having more or fewer interconnect layers than depicted.

In some embodiments, the interconnect structures 1228 may include lines 1228a and/or vias 1228b filled with an electrically conductive material such as a metal. The lines 1228a may be arranged to route electrical signals in a direction of a plane that is substantially parallel with a surface of the die substrate 1202 upon which the device layer 1204 is formed. For example, the lines 1228a may route electrical signals in a direction in and out of the page and/or in a direction across the page. The vias 1228b may be arranged to route electrical signals in a direction of a plane that is substantially perpendicular to the surface of the die substrate 1202 upon which the device layer 1204 is formed. In some embodiments, the vias 1228b may electrically couple lines 1228a of different interconnect layers 1206-1210 together.

The interconnect layers 1206-1210 may include a dielectric material 1226 disposed between the interconnect structures 1228, as shown in FIG. 12. In some embodiments, dielectric material 1226 disposed between the interconnect structures 1228 in different ones of the interconnect layers 1206-1210 may have different compositions; in other embodiments, the composition of the dielectric material 1226 between different interconnect layers 1206-1210 may be the same. The device layer 1204 may include a dielectric material 1226 disposed between the transistors 1240 and a bottom layer of the metallization stack as well. The dielectric material 1226 included in the device layer 1204 may have a different composition than the dielectric material 1226 included in the interconnect layers 1206-1210; in other embodiments, the composition of the dielectric material 1226 in the device layer 1204 may be the same as a dielectric material 1226 included in any one of the interconnect layers 1206-1210.

A first interconnect layer 1206 (referred to as Metal 1 or "M1") may be formed directly on the device layer 1204. In some embodiments, the first interconnect layer 1206 may include lines 1228a and/or vias 1228b, as shown. The lines 1228a of the first interconnect layer 1206 may be coupled with contacts (e.g., the S/D contacts 1224) of the device layer 1204. The vias 1228b of the first interconnect layer 1206 may be coupled with the lines 1228a of a second interconnect layer 1208.

The second interconnect layer 1208 (referred to as Metal 2 or "M2") may be formed directly on the first interconnect layer 1206. In some embodiments, the second interconnect layer 1208 may include via 1228b to couple the lines 1228 of the second interconnect layer 1208 with the lines 1228a of a third interconnect layer 1210. Although the lines 1228a and the vias 1228b are structurally delineated with a line within individual interconnect layers for the sake of clarity, the lines 1228a and the vias 1228b may be structurally and/or materially contiguous (e.g., simultaneously filled during a dual-damascene process) in some embodiments.

The third interconnect layer 1210 (referred to as Metal 3 or "M3") (and additional interconnect layers, as desired) may be formed in succession on the second interconnect layer 1208 according to similar techniques and configurations described in connection with the second interconnect layer 1208 or the first interconnect layer 1206. In some embodiments, the interconnect layers that are "higher up" in the metallization stack 1219 in the integrated circuit device 1200 (i.e., farther away from the device layer 1204) may be thicker that the interconnect layers that are lower in the metallization stack 1219, with lines 1228a and vias 1228b in the higher interconnect layers being thicker than those in the lower interconnect layers.

The integrated circuit device 1200 may include a solder resist material 1234 (e.g., polyimide or similar material) and one or more conductive contacts 1236 formed on the interconnect layers 1206-1210. In FIG. 12, the conductive contacts 1236 are illustrated as taking the form of bond pads. The conductive contacts 1236 may be electrically coupled with the interconnect structures 1228 and configured to route the electrical signals of the transistor(s) 1240 to external devices. For example, solder bonds may be formed on the one or more conductive contacts 1236 to mechanically and/or electrically couple an integrated circuit die including the integrated circuit device 1200 with another component (e.g., a printed circuit board). The integrated circuit device 1200 may include additional or alternate structures to route the electrical signals from the interconnect layers 1206-1210; for example, the conductive contacts 1236 may include other analogous features (e.g., posts) that route the electrical signals to external components. The conductive contacts 1236 may serve as the conductive pads 509, as appropriate.

In some embodiments in which the integrated circuit device 1200 is a double-sided die, the integrated circuit device 1200 may include another metallization stack (not shown) on the opposite side of the device layer(s) 1204. This metallization stack may include multiple interconnect layers as discussed above with reference to the interconnect layers 1206-1210, to provide conductive pathways (e.g., including conductive lines and vias) between the device layer(s) 1204 and additional conductive contacts (not shown) on the opposite side of the integrated circuit device 1200 from the conductive contacts 1236. These additional conductive contacts may serve as the conductive pads 509, as appropriate.

In other embodiments in which the integrated circuit device 1200 is a double-sided die, the integrated circuit device 1200 may include one or more through silicon vias (TSVs) through the die substrate 1202; these TSVs may make contact with the device layer(s) 1204, and may provide conductive pathways between the device layer(s) 1204 and additional conductive contacts (not shown) on the opposite side of the integrated circuit device 1200 from the conductive contacts 1236. These additional conductive contacts may serve as the conductive pads 509, as appropriate. In some embodiments, TSVs extending through the substrate can be used for routing power and ground signals from conductive contacts on the opposite side of the integrated circuit device 1200 from the conductive contacts 1236 to the transistors 1240 and any other components integrated into the die 1200, and the metallization stack 1219 can be used to route I/O signals from the conductive contacts 1236 to transistors 1240 and any other components integrated into the die 1200.

Multiple integrated circuit devices 1200 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 14:
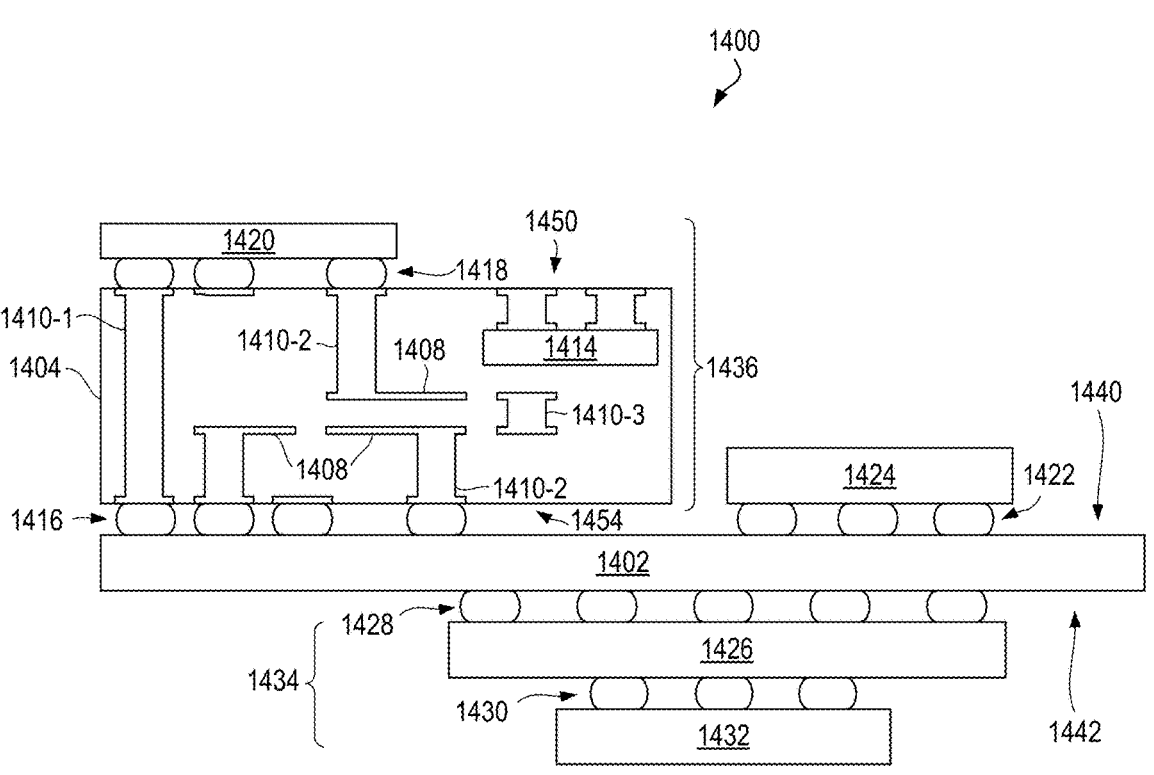
FIG. 14 is a cross-sectional side view of an integrated circuit device assembly, in accordance with any of the embodiments disclosed herein.

FIG. 14 is a cross-sectional side view of an integrated circuit device assembly 1400. In some embodiments, the integrated circuit device assembly 1400 may include or be included in the chip 510, 520. The integrated circuit device assembly 1400 includes a number of components disposed on a circuit board 1402 (which may be a motherboard, system board, mainboard, etc.). The integrated circuit device assembly 1400 includes components disposed on a first face 1440 of the circuit board 1402 and an opposing second face 1442 of the circuit board 1402; generally, components may be disposed on one or both faces 1440 and 1442. Any of the integrated circuit components discussed below with reference to the integrated circuit device assembly 1400 may include or be included in any suitable ones of the embodiments of the chips 510, 520 disclosed herein.

In some embodiments, the circuit board 1402 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 1402. In other embodiments, the circuit board 1402 may be a non-PCB substrate. In some embodiments the circuit board 1402 may be, for example, the circuit board 502. The integrated circuit device assembly 1400 illustrated in FIG. 14 includes a package-on-interposer structure 1436 coupled to the first face 1440 of the circuit board 1402 by coupling components 1416. The coupling components 1416 may electrically and mechanically couple the package-on-interposer structure 1436 to the circuit board 1402, and may include solder balls (as shown in FIG. 14), pins (e.g., as part of a pin grid array (PGA)), contacts (e.g., as part of a land grid array (LGA)), male and female portions of a socket, an adhesive, an underfill material, and/or any other suitable electrical and/or mechanical coupling structure.

The package-on-interposer structure 1436 may include an integrated circuit component 1420 coupled to an interposer 1404 by coupling components 1418. The coupling components 1418 may take any suitable form for the application, such as the forms discussed above with reference to the coupling components 1416. Although a single integrated circuit component 1420 is shown in FIG. 14, multiple integrated circuit components may be coupled to the interposer 1404; indeed, additional interposers may be coupled to the interposer 1404. The interposer 1404 may provide an intervening substrate used to bridge the circuit board 1402 and the integrated circuit component 1420.

The integrated circuit component 1420 may be a packaged or unpacked integrated circuit product that includes one or more integrated circuit dies (e.g., the die 1102 of FIG. 11, the integrated circuit device 1200 of FIG. 12) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 1420, a single monolithic integrated circuit die comprises solder bumps attached to contacts on the die. The solder bumps allow the die to be directly attached to the interposer 1404. The integrated circuit component 1420 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 1420 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 1420 comprises multiple integrated circuit dies, they dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 1420 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 1404 may spread connections to a wider pitch or reroute a connection to a different connection. For example, the interposer 1404 may couple the integrated circuit component 1420 to a set of ball grid array (BGA) conductive contacts of the coupling components 1416 for coupling to the circuit board 1402. In the embodiment illustrated in FIG. 14, the integrated circuit component 1420 and the circuit board 1402 are attached to opposing sides of the interposer 1404; in other embodiments, the integrated circuit component 1420 and the circuit board 1402 may be attached to a same side of the interposer 1404. In some embodiments, three or more components may be interconnected by way of the interposer 1404.

In some embodiments, the interposer 1404 may be formed as a PCB, including multiple metal layers separated from one another by layers of dielectric material and interconnected by electrically conductive vias. In some embodiments, the interposer 1404 may be formed of an epoxy resin, a fiberglass-reinforced epoxy resin, an epoxy resin with inorganic fillers, a ceramic material, or a polymer material such as polyimide. In some embodiments, the interposer 1404 may be formed of alternate rigid or flexible materials that may include the same materials described above for use in a semiconductor substrate, such as silicon, germanium, and other group III-V and group IV materials. The interposer 1404 may include metal interconnects 1408 and vias 1410, including but not limited to through hole vias 1410-1 (that extend from a first face 1450 of the interposer 1404 to a second face 1454 of the interposer 1404), blind vias 1410-2 (that extend from the first or second faces 1450 or 1454 of the interposer 1404 to an internal metal layer), and buried vias 1410-3 (that connect internal metal layers).

In some embodiments, the interposer 1404 can comprise a silicon interposer. Through silicon vias (TSV) extending through the silicon interposer can connect connections on a first face of a silicon interposer to an opposing second face of the silicon interposer. In some embodiments, an interposer 1404 comprising a silicon interposer can further comprise one or more routing layers to route connections on a first face of the interposer 1404 to an opposing second face of the interposer 1404.

The interposer 1404 may further include embedded devices 1414, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1404. The package-on-interposer structure 1436 may take the form of any of the package-on-interposer structures known in the art. In embodiments where the interposer is a non-printed circuit board The integrated circuit device assembly 1400 may include an integrated circuit component 1424 coupled to the first face 1440 of the circuit board 1402 by coupling components 1422. The coupling components 1422 may take the form of any of the embodiments discussed above with reference to the coupling components 1416, and the integrated circuit component 1424 may take the form of any of the embodiments discussed above with reference to the integrated circuit component 1420.

The integrated circuit device assembly 1400 illustrated in FIG. 14 includes a package-on-package structure 1434 coupled to the second face 1442 of the circuit board 1402 by coupling components 1428. The package-on-package structure 1434 may include an integrated circuit component 1426 and an integrated circuit component 1432 coupled together by coupling components 1430 such that the integrated circuit component 1426 is disposed between the circuit board 1402 and the integrated circuit component 1432. The coupling components 1428 and 1430 may take the form of any of the embodiments of the coupling components 1416 discussed above, and the integrated circuit components 1426 and 1432 may take the form of any of the embodiments of the integrated circuit component 1420 discussed above. The package-on-package structure 1434 may be configured in accordance with any of the package-on-package structures known in the art.

FIG. 15 is a block diagram of an example electrical device 1500 that may include one or more of the chips 510, 520 disclosed herein. For example, any suitable ones of the components of the electrical device 1500 may include one or more of the integrated circuit device assemblies 1400, integrated circuit components 1420, integrated circuit devices 1200, or integrated circuit dies 1102 disclosed. A number of components are illustrated in FIG. 15 as included in the electrical device 1500, but any one or more of these components may be omitted or duplicated, as suitable for the application. In some embodiments, some or all of the components included in the electrical device 1500 may be attached to one or more motherboards mainboards, or system boards. In some embodiments, one or more of these components are fabricated onto a single system-on-a-chip (SoC) die.

Additionally, in various embodiments, the electrical device 1500 may not include one or more of the components illustrated in FIG. 15, but the electrical device 1500 may include interface circuitry for coupling to the one or more components. For example, the electrical device 1500 may not include a display device 1506, but may include display device interface circuitry (e.g., a connector and driver circuitry) to which a display device 1506 may be coupled. In another set of examples, the electrical device 1500 may not include an audio input device 1524 or an audio output device 1508, but may include audio input or output device interface circuitry (e.g., connectors and supporting circuitry) to which an audio input device 1524 or audio output device 1508 may be coupled.

The electrical device 1500 may include one or more processor units 1502 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 1502 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 1500 may include a memory 1504, which may itself include one or more memory devices such as volatile memory (e.g., dynamic random access memory (DRAM), static random-access memory (SRAM)), nonvolatile memory (e.g., read-only memory (ROM), flash memory, chalcogenide-based phase-change non-voltage memories), solid state memory, and/or a hard drive. In some embodiments, the memory 1504 may include memory that is located on the same integrated circuit die as the processor unit 1502. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 1500 can comprise one or more processor units 1502 that are heterogeneous or asymmetric to another processor unit 1502 in the electrical device 1500. There can be a variety of differences between the processing units 1502 in a system in terms of a spectrum of metrics of merit including architectural, microarchitectural, thermal, power consumption characteristics, and the like. These differences can effectively manifest themselves as asymmetry and heterogeneity among the processor units 1502 in the electrical device 1500.

In some embodiments, the electrical device 1500 may include a communication component 1512 (e.g., one or more communication components). For example, the communication component 1512 can manage wireless communications for the transfer of data to and from the electrical device 1500. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 1512 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 1512 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 1512 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 1512 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 1512 may operate in accordance with other wireless protocols in other embodiments. The electrical device 1500 may include an antenna 1522 to facilitate wireless communications and/or to receive other wireless communications (such as AM or FM radio transmissions).

In some embodiments, the communication component 1512 may manage wired communications, such as electrical, optical, or any other suitable communication protocols (e.g., IEEE 802.3 Ethernet standards). As noted above, the communication component 1512 may include multiple communication components. For instance, a first communication component 1512 may be dedicated to shorter-range wireless communications such as Wi-Fi or Bluetooth, and a second communication component 1512 may be dedicated to longer-range wireless communications such as global positioning system (GPS), EDGE, GPRS, CDMA, WiMAX, LTE, EV-DO, or others. In some embodiments, a first communication component 1512 may be dedicated to wireless communications, and a second communication component 1512 may be dedicated to wired communications.

The electrical device 1500 may include battery/power circuitry 1514. The battery/power circuitry 1514 may include one or more energy storage devices (e.g., batteries or capacitors) and/or circuitry for coupling components of the electrical device 1500 to an energy source separate from the electrical device 1500 (e.g., AC line power).

The electrical device 1500 may include a display device 1506 (or corresponding interface circuitry, as discussed above). The display device 1506 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 1500 may include an audio output device 1508 (or corresponding interface circuitry, as discussed above). The audio output device 1508 may include any embedded or wired or wirelessly connected external device that generates an audible indicator, such speakers, headsets, or earbuds.

The electrical device 1500 may include an audio input device 1524 (or corresponding interface circuitry, as discussed above). The audio input device 1524 may include any embedded or wired or wirelessly connected device that generates a signal representative of a sound, such as microphones, microphone arrays, or digital instruments (e.g., instruments having a musical instrument digital interface (MIDI) output). The electrical device 1500 may include a Global Navigation Satellite System (GNSS) device 1518 (or corresponding interface circuitry, as discussed above), such as a Global Positioning System (GPS) device. The GNSS device 1518 may be in communication with a satellite-based system and may determine a geolocation of the electrical device 1500 based on information received from one or more GNSS satellites, as known in the art.

The electrical device 1500 may include an other output device 1510 (or corresponding interface circuitry, as discussed above). Examples of the other output device 1510 may include an audio codec, a video codec, a printer, a wired or wireless transmitter for providing information to other devices, or an additional storage device.

The electrical device 1500 may include an other input device 1520 (or corresponding interface circuitry, as discussed above). Examples of the other input device 1520 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 1500 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 1500 may be any other electronic device that processes data.

In some embodiments, the electrical device 1500 may comprise multiple discrete physical components. Given the range of devices that the electrical device 1500 can be manifested as in various embodiments, in some embodiments, the electrical device 1500 can be referred to as a computing device or a computing system.

Some examples of embodiments are provided below. As used in the following examples, the term "connected" may refer to an electrical connection. In some instances, the connection may be a direct connection between two items/components. Further, as used in the following examples, the term "coupled" may refer to a connection that may be direct or indirect. For example, a first component coupled to a second component may include a third component connected between the first and second components.

Example 1 includes an apparatus comprising an impedance matching network comprising an input; an output; a first capacitor connected to the input and a ground, wherein the first capacitor is a variable capacitor; a second capacitor connected to the input and the output; and an inductor connected to the output and the ground; and a spin qubit coupled to the output of the impedance matching network.

Example 2 includes the subject matter of Example 1, and wherein a matching frequency of the impedance matching network is over 250 megahertz.

Example 3 includes the subject matter of any of Examples 1 and 2, and further including a component coupled to the spin qubit, wherein the component coupled to the spin qubit is associated with a first resistance corresponding to a first qubit state of the spin qubit and a second resistance corresponding to a second qubit state of the spin qubit, wherein the first resistance is lower than the second resistance, wherein the output of the impedance matching network is connected to the component coupled to the spin qubit, wherein the impedance matching network transforms an impedance of the component coupled to the spin qubit to a characteristic impedance of a transmission line of a measurement network at the matching frequency when the component coupled to the spin qubit has the first resistance, wherein the first resistance is at least 100 kiloohms.

Example 4 includes the subject matter of any of Examples 1-3, and wherein the component coupled to the spin qubit is a single-electron transistor.

Example 5 includes the subject matter of any of Examples 1-4, and further including quantum/classical interface circuitry to determine an indication of the first resistance; and set a capacitance of the first capacitor based on the indication of the first resistance.

Example 6 includes the subject matter of any of Examples 1-5, and further including a single-electron transistor coupled to the spin qubit, wherein the single-electron transistor is associated with a first resistance corresponding to a first qubit state of the spin qubit and a second resistance corresponding to a second qubit state of the spin qubit, wherein the first resistance is lower than the second resistance, wherein the output of the impedance matching network is connected to the single-electron transistor, wherein the spin qubit is coupled to the output of the impedance matching network through the single-electron transistor.

Example 7 includes the subject matter of any of Examples 1-6, and wherein the impedance matching network has a first matching frequency when the first capacitor has a maximum capacitance, wherein the impedance matching network has a second matching frequency when the first capacitor has a minimum capacitance, wherein the second matching frequency is within 1% of the first matching frequency, wherein the impedance matching network has a first impedance transformation ratio when the first capacitor has the maximum capacitance, wherein the impedance matching network has a second impedance transformation ratio when the first capacitor has the minimum capacitance, wherein the second impedance transformation ratio is at least twice the first impedance transformation ratio.

Example 8 includes the subject matter of any of Examples 1-7, and wherein the second capacitor and the inductor each has a Q factor of at least one thousand when at an operating temperature of the impedance matching network.

Example 9 includes the subject matter of any of Examples 1-8, and wherein the operating temperature of the impedance matching network is less than 5 Kelvin.

Example 10 includes the subject matter of any of Examples 1-9, and wherein the second capacitor and the inductor comprise aluminum.

Example 11 includes the subject matter of any of Examples 1-10, and wherein the second capacitor and the inductor comprise niobium.

Example 12 includes the subject matter of any of Examples 1-11, and wherein the second capacitor and the inductor comprise niobium and nitrogen.

Example 13 includes the subject matter of any of Examples 1-12, and wherein the first capacitor is a cryogenic varactor.

Example 14 includes the subject matter of any of Examples 1-13, and wherein the second capacitor and the inductor are packaged together on a first chip, wherein the spin qubit is packaged on a second chip different from the first chip.

Example 15 includes the subject matter of any of Examples 1-14, and wherein the first capacitor comprises a plurality of fixed capacitors and one variable capacitor connected in parallel.

Example 16 includes the subject matter of any of Examples 1-15, and wherein the first capacitor, the second capacitor, the inductor, and the spin qubit are packaged together on a chip.

Example 17 includes the subject matter of any of Examples 1-16, and further including a stimulus source to send a radio-frequency pulse to the impedance matching network; a receiver to receive a reflection of the radio-frequency pulse from the impedance matching network; and quantum/classical interface circuitry to determine a state of the spin qubit based on the reflection of the radio-frequency pulse from the impedance matching network.

Example 18 includes the subject matter of any of Examples 1-17, and wherein the receiver is to measure an in-phase component and a quadrature component of the reflection of the radio-frequency pulse from the impedance matching network.

Example 19 includes the subject matter of any of Examples 1-18, and wherein the quantum/classical interface circuitry is to determine a resistance state of the spin qubit based on the reflection of the radio-frequency pulse from the impedance matching network.

Example 20 includes the subject matter of any of Examples 1-19, and further including a plurality of spin qubits.

Example 21 includes the subject matter of any of Examples 1-20, and further including a component coupled to the spin qubit, wherein the component coupled to the spin qubit is associated with a first resistance corresponding to a first qubit state of the spin qubit and a second resistance corresponding to a second qubit state of the spin qubit, wherein the first resistance is lower than the second resistance, wherein the output of the impedance matching network is connected to the component coupled to the spin qubit, wherein the impedance matching network transforms an impedance of the component coupled to the spin qubit to an impedance less than half of a characteristic impedance of a transmission line of a measurement network at a measurement frequency when the component coupled to the spin qubit has the first resistance, wherein the impedance matching network transforms an impedance of the component coupled to the spin qubit to an impedance more than twice the characteristic impedance of the transmission line at the measurement frequency when the component coupled to the spin qubit has the second resistance.

Example 22 includes an apparatus comprising a spin qubit; a transmission line of a measurement network, the transmission line having a characteristic impedance; and an impedance matching network connected to the transmission line and connected to a component coupled to the spin qubit, wherein the component coupled to the spin qubit is associated with a first resistance corresponding to a first qubit state of the spin qubit and a second resistance corresponding to a second qubit state of the spin qubit, wherein the impedance matching network transforms an impedance into the component coupled to the spin qubit to an impedance less than the characteristic impedance of the transmission line at a measurement frequency when the component coupled to the spin qubit has the first resistance, wherein the impedance matching network transforms an impedance of the component coupled to the spin qubit to an impedance more than the characteristic impedance of the transmission line at the measurement frequency when the component coupled to the spin qubit has the second resistance.

Example 23 includes the subject matter of Example 22, and wherein the impedance matching network transforms an impedance into the component coupled to the spin qubit to an impedance less than half of the characteristic impedance of the transmission line at the measurement frequency when the component coupled to the spin qubit has the first resistance, wherein the impedance matching network transforms an impedance of the component coupled to the spin qubit to an impedance more than twice the characteristic impedance of the transmission line at the measurement frequency when the component coupled to the spin qubit has the second resistance.

Example 24 includes the subject matter of any of Examples 22 and 23, and wherein the impedance matching network transforms an impedance into the component coupled to the spin qubit to an impedance less than 98% of the characteristic impedance of the transmission line at the measurement frequency when the component coupled to the spin qubit has the first resistance, wherein the impedance matching network transforms an impedance of the component coupled to the spin qubit to an impedance more than 102% of the characteristic impedance of the transmission line at the measurement frequency when the component coupled to the spin qubit has the second resistance.

Example 25 includes the subject matter of any of Examples 22-24, and wherein the measurement frequency of the impedance matching network is over 250 megahertz.

Example 26 includes the subject matter of any of Examples 22-25, and wherein the first resistance is at least 100 kiloohms.

Example 27 includes the subject matter of any of Examples 22-26, and wherein the component coupled to the spin qubit is a single-electron transistor.

Example 28 includes the subject matter of any of Examples 22-27, and further including quantum/classical interface circuitry to determine an indication of the first resistance; and set a capacitance of a capacitor based on the indication of the first resistance.

Example 29 includes the subject matter of any of Examples 22-28, and wherein the component coupled to the spin qubit is a single-electron transistor, wherein an output of the impedance matching network is connected to the single-electron transistor, wherein the spin qubit is coupled to the output of the impedance matching network through the single-electron transistor.

Example 30 includes the subject matter of any of Examples 22-29, and wherein the impedance matching network comprises an input; an output; a first capacitor connected to the input and a ground, wherein the first capacitor is a variable capacitor; a second capacitor connected to the input and the output; and an inductor connected to the output and the ground, wherein the impedance matching network has a first matching frequency when the first capacitor has a maximum capacitance, wherein the impedance matching network has a second matching frequency when the first capacitor has a minimum capacitance, wherein the second matching frequency is within 1% of the first matching frequency, wherein the impedance matching network has a first impedance transformation ratio when the first capacitor has the maximum capacitance, wherein the impedance matching network has a second impedance transformation ratio when the first capacitor has the minimum capacitance, wherein the second impedance transformation ratio is at least twice the first impedance transformation ratio.

Example 31 includes the subject matter of any of Examples 22-30, and wherein the second capacitor and the inductor each has a Q factor of at least one thousand when at an operating temperature of the impedance matching network.

Example 32 includes the subject matter of any of Examples 22-31, and wherein the operating temperature of the impedance matching network is less than 5 Kelvin.

Example 33 includes the subject matter of any of Examples 22-32, and wherein the second capacitor and the inductor comprise aluminum.

Example 34 includes the subject matter of any of Examples 22-33, and wherein the second capacitor and the inductor comprise niobium.

Example 35 includes the subject matter of any of Examples 22-34, and wherein the second capacitor and the inductor comprise niobium and nitrogen.

Example 36 includes the subject matter of any of Examples 22-35, and wherein the first capacitor is a cryogenic varactor.

Example 37 includes the subject matter of any of Examples 22-36, and wherein the second capacitor and the inductor are packaged together on a first chip, wherein the spin qubit is packaged on a second chip different from the first chip.

Example 38 includes the subject matter of any of Examples 22-37, and wherein the first capacitor comprises a plurality of fixed capacitors and one variable capacitor connected in parallel.

Example 39 includes the subject matter of any of Examples 22-38, and wherein the first capacitor, the second capacitor, the inductor, and the spin qubit are packaged together on a chip.

Example 40 includes the subject matter of any of Examples 22-39, and further including a stimulus source to send a radio-frequency pulse to the impedance matching network; and a receiver to receive a reflection of the radio-frequency pulse from the impedance matching network; and quantum/classical interface circuitry to determine a state of the spin qubit based on the reflection of the radio-frequency pulse from the impedance matching network.

Example 41 includes the subject matter of any of Examples 22-40, and wherein the receiver is to measure an in-phase component and a quadrature component of the reflection of the radio-frequency pulse from the impedance matching network.

Example 42 includes the subject matter of any of Examples 22-41, and wherein the quantum/classical interface circuitry is to determine a resistance state of the spin qubit based on the reflection of the radio-frequency pulse from the impedance matching network.

Example 43 includes the subject matter of any of Examples 22-42, and further including a plurality of spin qubits, wherein the plurality of spin qubits comprises the spin qubit.

Example 44 includes an apparatus comprising an impedance matching network comprising an input; an output; a first capacitor connected to the input and a ground, wherein the first capacitor is a variable capacitor; a second capacitor connected to the input and the output; and an inductor connected to the output and the ground, wherein the second capacitor and the inductor each has a Q factor of at least one thousand when at an operating temperature of the impedance matching network.

Example 45 includes the subject matter of Example 44, and wherein a matching frequency of the impedance matching network is over 250 megahertz.

Example 46 includes the subject matter of any of Examples 44 and 45, and further including a spin qubit coupled to the output of the impedance matching network; and a component coupled to the spin qubit, wherein the component coupled to the spin qubit is associated with a first resistance corresponding to a first qubit state of the spin qubit and a second resistance corresponding to a second qubit state of the spin qubit, wherein the first resistance is lower than the second resistance, wherein the output of the impedance matching network is connected to the component coupled to the spin qubit, wherein the impedance matching network transforms an impedance of the component coupled to the spin qubit to a characteristic impedance of a transmission line of a measurement network at the matching frequency when the component coupled to the spin qubit has the first resistance, wherein the first resistance is at least 100 kiloohms.

Example 47 includes the subject matter of any of Examples 44-46, and wherein the component coupled to the spin qubit is a single-electron transistor.

Example 48 includes the subject matter of any of Examples 44-47, and further including quantum/classical interface circuitry to determine an indication of the first resistance; and set a capacitance of the first capacitor based on the indication of the first resistance.

Example 49 includes the subject matter of any of Examples 44-48, and further including a single-electron transistor coupled to a spin qubit of the apparatus, wherein the single-electron transistor is associated with a first resistance corresponding to a first qubit state of the spin qubit and a second resistance corresponding to a second qubit state of the spin qubit, wherein the first resistance is lower than the second resistance, wherein the output of the impedance matching network is connected to the single-electron transistor, wherein the spin qubit is coupled to the output of the impedance matching network through the single-electron transistor.

Example 50 includes the subject matter of any of Examples 44-49, and wherein the impedance matching network has a first matching frequency when the first capacitor has a maximum capacitance, wherein the impedance matching network has a second matching frequency when the first capacitor has a minimum capacitance, wherein the second matching frequency is within 1% of the first matching frequency, wherein the impedance matching network has a first impedance transformation ratio when the first capacitor has the maximum capacitance, wherein the impedance matching network has a second impedance transformation ratio when the first capacitor has the minimum capacitance, wherein the second impedance transformation ratio is at least twice the first impedance transformation ratio.

Example 51 includes the subject matter of any of Examples 44-50, and wherein the operating temperature of the impedance matching network is less than 5 Kelvin.

Example 52 includes the subject matter of any of Examples 44-51, and wherein the second capacitor and the inductor comprise aluminum.

Example 53 includes the subject matter of any of Examples 44-52, and wherein the second capacitor and the inductor comprise niobium.

Example 54 includes the subject matter of any of Examples 44-53, and wherein the second capacitor and the inductor comprise niobium and nitrogen.

Example 55 includes the subject matter of any of Examples 44-54, and wherein the first capacitor is a cryogenic varactor.

Example 56 includes the subject matter of any of Examples 44-55, and wherein the second capacitor and the inductor are packaged together on a first chip, further comprising a spin qubit packaged on a second chip different from the first chip.

Example 57 includes the subject matter of any of Examples 44-56, and wherein the first capacitor comprises a plurality of fixed capacitors and one variable capacitor connected in parallel.

Example 58 includes the subject matter of any of Examples 44-57, and wherein the first capacitor, the second capacitor, the inductor, and a spin qubit are packaged together on a chip.

Example 59 includes the subject matter of any of Examples 44-58, and further including a stimulus source to send a radio-frequency pulse to the impedance matching network; a receiver to receive a reflection of the radio-frequency pulse from the impedance matching network; and quantum/classical interface circuitry to determine a state of a spin qubit of the apparatus based on the reflection of the radio-frequency pulse from the impedance matching network.

Example 60 includes the subject matter of any of Examples 44-59, and wherein the receiver is to measure an in-phase component and a quadrature component of the reflection of the radio-frequency pulse from the impedance matching network.

Example 61 includes the subject matter of any of Examples 44-60, and wherein the quantum/classical interface circuitry is to determine a resistance state of the spin qubit based on the reflection of the radio-frequency pulse from the impedance matching network.

Example 62 includes the subject matter of any of Examples 44-61, and further including a plurality of spin qubits.

Example 63 includes the subject matter of any of Examples 44-62, and further including a spin qubit and a component coupled to the spin qubit, wherein the component coupled to the spin qubit is associated with a first resistance corresponding to a first qubit state of the spin qubit and a second resistance corresponding to a second qubit state of the spin qubit, wherein the first resistance is lower than the second resistance, wherein the output of the impedance matching network is connected to the component coupled to the spin qubit, wherein the impedance matching network transforms an impedance of the component coupled to the spin qubit to an impedance less than half of a characteristic impedance of a transmission line of a measurement network at a measurement frequency when the component coupled to the spin qubit has the first resistance, wherein the impedance matching network transforms an impedance of the component coupled to the spin qubit to an impedance more than twice the characteristic impedance of the transmission line at the measurement frequency when the component coupled to the spin qubit has the second resistance.

In the foregoing, a detailed description has been given with reference to specific example embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment(s) and other exemplarily language does not necessarily refer to the same embodiment or the same example, but may refer to different and distinct embodiments, as well as potentially the same embodiment.

The invention claimed is:

1. An apparatus comprising:
an impedance matching network comprising:
    an input;
    an output;
    a first capacitor connected to the input and a ground, wherein the first capacitor is a variable capacitor;
    a second capacitor connected to the input and the output; and
    an inductor connected to the output and the ground;
a spin qubit coupled to the output of the impedance matching network; and
a single-electron transistor coupled to the spin qubit,
wherein the single-electron transistor is associated with a first resistance corresponding to a first qubit state of the spin qubit and a second resistance corresponding to a second qubit state of the spin qubit, wherein the first resistance is lower than the second resistance,
wherein the output of the impedance matching network is connected to the single-electron transistor,
wherein the spin qubit is coupled to the output of the impedance matching network through the single-electron transistor.

2. The apparatus of claim 1, wherein a matching frequency of the impedance matching network is over 250 megahertz.

3. The apparatus of claim 2, further comprising a component coupled to the spin qubit,
wherein the component coupled to the spin qubit is associated with a first resistance corresponding to a first qubit state of the spin qubit and a second resistance corresponding to a second qubit state of the spin qubit, wherein the first resistance is lower than the second resistance,
wherein the output of the impedance matching network is connected to the component coupled to the spin qubit, wherein the impedance matching network transforms an impedance of the component coupled to the spin qubit to a characteristic impedance of a transmission line of a measurement network at the matching frequency when the component coupled to the spin qubit has the first resistance,
wherein the first resistance is at least 100 kiloohms.

4. The apparatus of claim 3, further comprising quantum/classical interface circuitry to:
determine an indication of the first resistance; and
set a capacitance of the first capacitor based on the indication of the first resistance.

5. The apparatus of claim 1, wherein the impedance matching network has a first matching frequency when the first capacitor has a maximum capacitance,
wherein the impedance matching network has a second matching frequency when the first capacitor has a minimum capacitance,
wherein the second matching frequency is within 1% of the first matching frequency,
wherein the impedance matching network has a first impedance transformation ratio when the first capacitor has the maximum capacitance,
wherein the impedance matching network has a second impedance transformation ratio when the first capacitor has the minimum capacitance,
wherein the second impedance transformation ratio is at least twice the first impedance transformation ratio.

6. The apparatus of claim 1, wherein the second capacitor and the inductor each has a Q factor of at least one thousand when at an operating temperature of the impedance matching network.

7. The apparatus of claim 1, wherein the first capacitor is a cryogenic varactor.

8. The apparatus of claim 1, wherein the second capacitor and the inductor are packaged together on a first chip,
wherein the spin qubit is packaged on a second chip different from the first chip.

9. The apparatus of claim 1, wherein the first capacitor comprises a plurality of fixed capacitors and one variable capacitor connected in parallel.

10. The apparatus of claim 1, wherein the first capacitor, the second capacitor, the inductor, and the spin qubit are packaged together on a chip.

11. The apparatus of claim 1, further comprising:
a stimulus source to send a radio-frequency pulse to the impedance matching network;
a receiver to receive a reflection of the radio-frequency pulse from the impedance matching network; and
quantum/classical interface circuitry to determine a state of the spin qubit based on the reflection of the radio-frequency pulse from the impedance matching network.

12. The apparatus of claim 11, wherein the receiver is to measure an in-phase component and a quadrature component of the reflection of the radio-frequency pulse from the impedance matching network.

13. The apparatus of claim 11, wherein the quantum/classical interface circuitry is to determine a resistance state of the spin qubit based on the reflection of the radio-frequency pulse from the impedance matching network.

14. The apparatus of claim 1, further comprising a plurality of spin qubits.

15. The apparatus of claim 1, further comprising a component coupled to the spin qubit,
wherein the component coupled to the spin qubit is associated with a first resistance corresponding to a first qubit state of the spin qubit and a second resistance corresponding to a second qubit state of the spin qubit, wherein the first resistance is lower than the second resistance, wherein the output of the impedance matching network is connected to the component coupled to the spin qubit, wherein the impedance matching network transforms an impedance of the component coupled to the spin qubit to an impedance less than half of a characteristic impedance of a transmission line of a measurement network at a measurement frequency when the component coupled to the spin qubit has the first resistance, wherein the impedance matching network transforms an impedance of the component coupled to the spin qubit to an impedance more than twice the characteristic impedance of the transmission line at the measurement frequency when the component coupled to the spin qubit has the second resistance.

16. An apparatus comprising:

an impedance matching network comprising:
    an input;
    an output;
    a first capacitor connected to the input and a ground, wherein the first capacitor is a variable capacitor;
    a second capacitor connected to the input and the output; and
    an inductor connected to the output and the ground;

a spin qubit coupled to the output of the impedance matching network; and a component coupled to the spin qubit, wherein the second capacitor and the inductor each has a Q factor of at least one thousand when at an operating temperature of the impedance matching network, wherein the component coupled to the spin qubit is associated with a first resistance corresponding to a first qubit state of the spin qubit and a second resistance corresponding to a second qubit state of the spin qubit, wherein the first resistance is lower than the second resistance, wherein the output of the impedance matching network is connected to the component coupled to the spin qubit, wherein the impedance matching network transforms an impedance of the component coupled to the spin qubit to a characteristic impedance of a transmission line of a measurement network at a matching frequency of the impedance matching network when the component coupled to the spin qubit has the first resistance, wherein the first resistance is at least 100 kiloohms.

17. The apparatus of claim 16, wherein the operating temperature of the impedance matching network is less than 5 Kelvin.

18. The apparatus of claim 16, wherein the second capacitor and the inductor comprise aluminum.

* * * * *